US010963411B1

(12) United States Patent
Voogel et al.

(10) Patent No.: US 10,963,411 B1
(45) Date of Patent: Mar. 30, 2021

(54) INTEGRATING ROWS OF INPUT/OUTPUT BLOCKS WITH MEMORY CONTROLLERS IN A COLUMNAR PROGRAMMABLE FABRIC ARCHETURE

(71) Applicant: XILINX, INC., San Jose, CA (US)

(72) Inventors: Martin L. Voogel, Niwot, CO (US); Trevor J. Bauer, Boulder, CO (US); Rafael C. Camarota, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/502,141

(22) Filed: Jul. 3, 2019

(51) Int. Cl.
  *G06F 13/40* (2006.01)
  *G06F 13/20* (2006.01)
  *G06F 13/16* (2006.01)
  *G06F 13/12* (2006.01)
  *H03M 1/12* (2006.01)

(52) U.S. Cl.
  CPC ........ *G06F 13/4022* (2013.01); *G06F 13/122* (2013.01); *G06F 13/1668* (2013.01); *G06F 13/20* (2013.01); *H03M 1/12* (2013.01)

(58) Field of Classification Search
  CPC ............. G06F 13/4068; G06F 13/4022; G06F 13/122; G06F 13/20; G06F 13/1668; G06F 15/7825; H01R 29/00; H05K 3/222
  USPC .................... 710/11, 14, 31, 33, 38, 62, 105
  See application file for complete search history.

(56) References Cited

U.S. PATENT DOCUMENTS

| | | | | |
|---|---|---|---|---|
| 5,317,698 A | * | 5/1994 | Chan ................ | H03K 19/17744 326/47 |
| 5,625,301 A | * | 4/1997 | Plants .............. | H03K 19/17744 326/41 |
| 10,002,100 B2 | | 6/2018 | Kaviani et al. | |
| 10,042,806 B2 | | 8/2018 | Kaviani et al. | |
| 10,642,946 B2 | * | 5/2020 | Teh .................. | H03K 19/17744 |
| 2007/0075734 A1 | * | 4/2007 | Ramos ............... | G06F 15/7867 326/41 |
| 2011/0268137 A1 | * | 11/2011 | Hill .................. | H03K 19/17744 370/479 |
| 2013/0278289 A1 | * | 10/2013 | Jang ..................... | H03K 19/173 326/38 |

(Continued)

*Primary Examiner* — Idriss N Alrobaye
*Assistant Examiner* — Henry W Yu
(74) *Attorney, Agent, or Firm* — Patterson + Sheridan, LLP

(57) ABSTRACT

Programmable devices and methods of operation are disclosed. In some embodiments, a programmable device may include programmable logic selectively coupled to a plurality of input/output (I/O) interface circuits by a programmable interconnect fabric and a network-on-chip (NoC) interconnect system. The programmable logic may include configurable logic elements, programmable interconnects, and dedicated circuitry. The programmable interconnects may form part of the programmable interconnect fabric. In some embodiments, the programmable interconnect fabric selectively routes non-packetized data between the programmable logic and a first group of I/O interface circuits, and the NoC interconnect system selectively routes packetized data between the programmable logic and a second group of I/O interface circuits. The NoC interconnect system may operate according to a data packet protocol, and the second group of I/O interface circuits may include memory controllers compatible with the data packet protocol.

20 Claims, 12 Drawing Sheets

(56) References Cited

U.S. PATENT DOCUMENTS

| | | | |
|---|---|---|---|
| 2017/0220499 A1* | 8/2017 | Gray | H04L 49/109 |
| 2019/0044519 A1* | 2/2019 | Atsatt | G06F 15/7825 |
| 2019/0065188 A1* | 2/2019 | Shippy | G06F 15/7825 |
| 2019/0138493 A1* | 5/2019 | Teh | G06F 13/1673 |

* cited by examiner

FIG. 5

INTEGRATING ROWS OF INPUT/OUTPUT BLOCKS WITH MEMORY CONTROLLERS IN A COLUMNAR PROGRAMMABLE FABRIC ARCHETURE

TECHNICAL FIELD

Aspects of the present disclosure generally relate to integrated circuits, and more specifically to programmable devices that include programmable signal interconnections between input/output (I/O) resources, programmable fabric, and other subsystems of programmable devices.

BACKGROUND

Programmable logic devices (PLDs) are well-known general-purpose devices that may be programmed by a user to implement a variety of user-specified circuit designs. One example of a PLD is a field programmable gate array (FPGA). An FPGA may include an array of configurable logic blocks (CLBs), dedicated random access memory blocks (BRAM), input/output blocks (IOBs), digital signal processors (DSPs), a number of processing cores, and other subsystems (such as memory controllers, device management resources, and configuration circuitry) that may be selectively connected together by a programmable interconnect structure.

A user-specified circuit design may be implemented within a programmable device by loading configuration data representative of the user-specified circuit design into configuration registers that collectively determine the functions and operations performed by the various blocks, interconnect structures, and subsystems of programmable device. For example, the configuration data may determine the functions and operations performed by the CLBs, DSPs, and the processing cores (both individually and collectively), and may configure the programmable interconnect structure to provide signal interconnections between various components of the programmable device to implement the user-specified circuit design. In this manner, a user may program or configure the programmable device to perform a multitude of different functions and operations by loading configuration data representative of a desired circuit design into the configuration registers of the programmable device.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Aspects of the present disclosure are directed to programmable devices and methods of their operation. An example programmable device is disclosed that includes programmable logic, dedicated circuitry, a row of input/output (I/O) interface circuits, a programmable interconnect fabric, and a network-on-chip (NoC) interconnect system. The programmable logic may include a plurality of configurable logic elements and a plurality of programmable interconnects. The dedicated circuitry may be provided within a first region of the programmable logic and positioned along a first portion of a boundary of the programmable logic. In some aspects, the dedicated circuitry may include at least one of a processor, a serial transceiver, a digital signal processor (DSP), an analog-to-digital converter (ADC), or a digital-to-analog converter (DAC).

The row of I/O interface circuits may be arranged along the boundary of the programmable logic and coupled to corresponding sets of I/O pins of the programmable devices. In some embodiments, a first group of the I/O interface circuits may be positioned beneath the first region that includes the dedicated circuitry, and a second group of the I/O interface circuits may be positioned beneath a second region of the programmable logic that does not include the dedicated circuitry. Each of the first group of I/O interface circuits may include a memory controller configured to communicate with the NoC interconnect system according to a data packet protocol. In some aspects, the memory controller may be a double data rate (DDR) memory controller. In addition, or in the alternative, the memory controller may include a protocol controller compatible with the data packet protocol, and a scheduler to schedule transmissions of data packets to the NoC interconnect system based at least in part on a priority or traffic class of the data packets.

The programmable interconnect fabric may selectively route data between the programmable logic and the second group of I/O interface circuits based on configuration data. In some embodiments, the programmable interconnect fabric includes the programmable interconnects. The NoC interconnect system may span across a height and a width of the programmable logic, and may selectively route data between the programmable logic and the first group of I/O interface circuits. In some embodiments, the NoC interconnect system may route the data between the programmable logic and the first group of I/O interface circuits as individually addressable data packets.

In some embodiments, the programmable device may also include a boundary logic interface (BLI) extending across the second region of the programmable logic. The BLI may provide connectivity between the second group of I/O interface circuits and the programmable interconnects based on the configuration data. In some aspects, the positioning of the dedicated circuitry may prevent the BLI from providing connectivity between the first group of I/O interface circuits and the programmable interconnects.

An example system is disclosed that includes a programmable device coupled to a memory device. The programmable device may include programmable logic, dedicated circuitry, a row of input/output (I/O) interface circuits, a programmable interconnect fabric, and a NoC interconnect system. The programmable logic may include a plurality of columns of programmable fabric sub-regions. The dedicated circuitry may be provided within a first region of the programmable logic and positioned along a first portion of a boundary of the programmable logic. In some aspects, the dedicated circuitry may include at least one of a processor, a serial transceiver, a digital signal processor (DSP), an analog-to-digital converter (ADC), or a digital-to-analog converter (DAC).

The row of I/O interface circuits may be arranged along the boundary of the programmable logic and coupled to corresponding sets of I/O pins of the programmable devices. In some embodiments, a first group of the I/O interface circuits may be positioned beneath the first region that includes the dedicated circuitry, and a second group of the I/O interface circuits may be positioned beneath a second region of the programmable logic that does not include the dedicated circuitry. Each of the first group of I/O interface circuits may include a memory controller configured to communicate with the NoC interconnect system according to a data packet protocol. In some aspects, the memory controller may be a double data rate (DDR) memory controller. In addition, or in the alternative, the memory controller may include a protocol controller compatible with the data packet protocol, and a scheduler to schedule transmissions of data packets to the NoC interconnect system based at least in part on a priority or traffic class of the data packets.

The programmable interconnect fabric may selectively route data between the programmable logic and the second group of I/O interface circuits based on configuration data. In some embodiments, the programmable interconnect fabric may include the programmable interconnects. The NoC interconnect system may span across a height and a width of the programmable logic, and may selectively route data between the programmable logic and the first group of I/O interface circuits. In some embodiments, the NoC interconnect system may route the data between the programmable logic and the first group of I/O interface circuits as individually addressable data packets.

In some embodiments, the programmable device may also include a boundary logic interface (BLI) extending across the second region of the programmable logic. The BLI may provide connectivity between the second group of I/O interface circuits and the programmable fabric sub-regions based on the configuration data. In some aspects, the positioning of the dedicated circuitry may prevent the BLI from providing connectivity between the first group of I/O interface circuits and the programmable fabric sub-regions.

An example method disclosed herein may be used to operate a programmable device. The method may include configuring a number of resources of the device's programmable fabric based on configuration data; identifying at least one of a plurality of input/output (I/O) interface circuits of the device without connectivity to the programmable fabric via a device-level interconnect system; configuring the at least one identified I/O interface circuit to communicate with a NoC interconnect system; configuring the non-identified I/O interface circuits to communicate with the device-level interconnect system; selectively routing data between the programmable fabric and the I/O pins corresponding to the non-identified I/O interface circuits using the device-level interconnect system; and selectively routing data between the programmable fabric and the I/O pins corresponding to the at least one identified I/O interface circuit using the NoC interconnect system and a memory controller integrated within each of the at least one identified I/O interface circuit. In some embodiments, the memory controller and the NoC interconnect system operate according to a data packet protocol, In addition, or in the alternative, the NoC interconnect system may route the data between the programmable logic and the at least one identified I/O interface circuit as individually addressable data packets.

In some embodiments, the method also includes configuring a boundary logic interface (BLI) to provide interconnections between the programmable fabric and the non-identified I/O interface circuits based on the configuration data. In some aspects, the identifying is based at least in part on a distance between a respective I/O interface circuit and a nearest programmable interconnect element.

BRIEF DESCRIPTION OF THE DRAWINGS

The example embodiments are illustrated by way of example and are not intended to be limited by the figures of the accompanying drawings. Like numbers reference like elements throughout the drawings and specification.

FIG. 5 shows a block diagram of another example programmable fabric including rows of I/O interface circuits, in accordance with some embodiments.

DETAILED DESCRIPTION

Figure 1A:
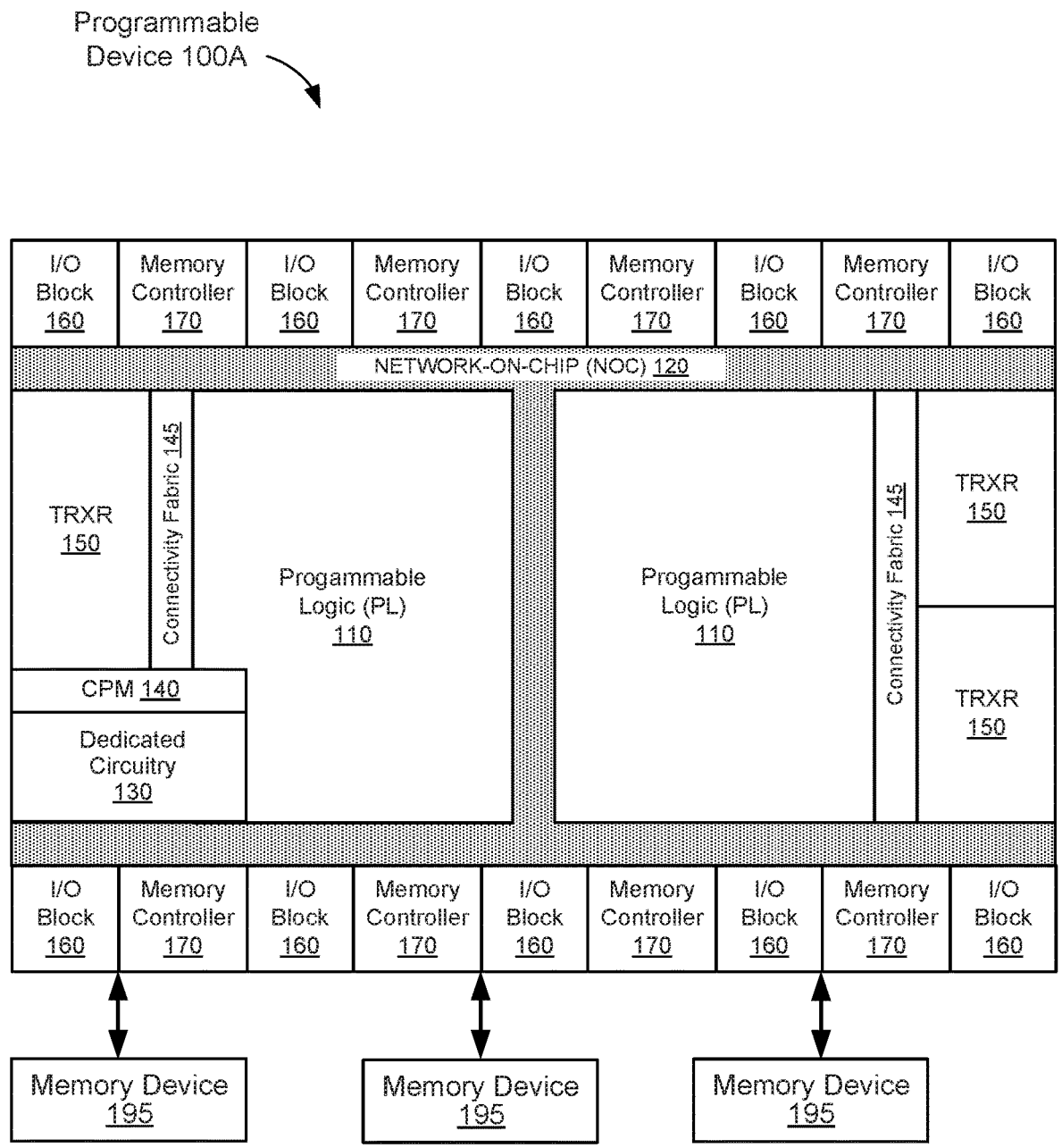
FIG. 1A shows a block diagram of an example programmable device within which embodiments of the present disclosure may be implemented.

Aspects of the present disclosure may improve the performance of a programmable device by selectively configuring I/O interface circuits positioned along a perimeter or edges of the device to selectively route information between the device's I/O pins and its programmable fabric using either a device-level programmable interconnect fabric or a network-level programmable interconnect system. The programmable interconnect fabric may provide block-level and device-level programmable interconnections between the various programmable resources, I/O resources, dedicated processing resources, and other components within or coupled to the device. In some embodiments, the programmable interconnect fabric may include or may be formed by a number of programmable interconnect elements within and/or between various programmable blocks (such as configurable logic elements (CLEs) and memory resources) provided within the programmable fabric. In some aspects, the programmable interconnect fabric may be configured to selectively route information between the device's I/O pins and the programmable fabric as non-packetized data.

The NoC interconnect system may provide high-speed and high-bandwidth connectivity between the various programmable resources, I/O resources, dedicated circuitry, and other components within or coupled to the device in a system-wide manner. In some embodiments, the NoC interconnect system may span across a height and a width of the programmable logic or programmable fabric of the device. In some aspects, the NoC interconnect system may be a packet-based network across which information may be transmitted as packetized data (e.g.; as individually addressable data packets) using a data packet protocol such as, for example, an IP protocol, an Ethernet protocol, or other suitable protocol. In one or more embodiments, the NoC interconnect system may use memory-mapped addresses assigned to various components of the device to route packetized data from a source address to one or more destination addresses.

The NoC interconnect system may alleviate signal routing burdens, contention latencies, and/or resource oversubscription associated with the programmable interconnect fabric by selectively interconnecting the device's I/O pins with its programmable resources and dedicated circuitry that may demand and use large amounts of data. By supplementing the routing capabilities of the programmable interconnect fabric with the NoC interconnect system, aspects of the present disclosure may increase device performance and allow for greater configuration flexibility, for example, by providing connectivity to one or more device resources not serviced by the programmable interconnect fabric. Moreover, by providing a system-wide signal routing network having greater data throughput and lower error rates than device-level programmable interconnects, the NoC interconnect system may increase data processing speeds while reducing signal routing latencies (as compared to other programmable devices).

The device may include a plurality of I/O interface circuits positioned along the perimeter of the device and coupled to the device's I/O pins. In some embodiments, the I/O interface circuits may be configured to selectively exchange information between the device's I/O pins and its programmable fabric using either the programmable interconnect fabric or the NoC interconnect system. Some or all of the I/O interface circuits may include an integrated memory controller that can transmit and receive packetized data using the same or similar data packet protocol used by the NoC interconnect system. In some aspects, the memory controller may be a double data rate (DDR) memory controller such as for example, a DDR4 or DDR5 memory controller. In this manner, the memory controllers provided within the I/O interface circuits may obviate a need for additional or dedicated circuitry to convert packetized data to non-packetized data (e.g., when receiving data packets from the NoC interconnect system) and to convert non-packetized data to packetized data (e.g., when transmitting data packets to the NoC interconnect system).

The programmable device may include dedicated circuitry including (but not limited to) one or more processors, one or more serial transceivers, one or more digital signal processors (DSPs), one or more analog-to-digital converters (ADCs), one or more digital-to-analog converters (DACs), or any combination thereof. In some embodiments, the dedicated circuitry may be provided within a first region of the programmable logic and positioned along a first portion of a boundary of the programmable logic. The positioning of the dedicated circuitry relative to the I/O interface circuits may prevent (or at least render difficult) some of the I/O interface circuits from having connectivity with one or more portions of the programmable logic (or, in some aspects, all of the programmable logic) using device-level interconnect systems.

In some embodiments, a first group of the I/O interface circuits may be positioned beneath the first region that includes the dedicated circuitry, and a second group of the I/O interface circuits may be positioned beneath a second region of the programmable logic that does not include the dedicated circuitry. Device-level interconnect systems (such as the programmable interconnect fabric) may provide connectivity between the programmable logic and the second group of I/O interface circuits based on configuration data, and the NoC interconnect system may provide connectivity between the programmable logic and the first group of I/O interface circuits (and may also provide connectivity between the programmable logic and the second group of I/O interface circuits). By providing a mechanism that allows each of the I/O interface circuits to have connectivity with the programmable logic, regardless of their respective positions relative to the dedicated circuitry, the NoC interconnect system may improve the performance and flexibility of the programmable device.

In one or more embodiments, the programmable device may include a boundary logic interface (BLI) extending across the second region of the programmable logic and configured to provide connectivity between the second group of I/O interface circuits and the programmable interconnects based on the configuration data. In some aspects, the positioning of the dedicated circuitry may prevent the BLI from providing connectivity between the first group of I/O interface circuits and the programmable interconnects provided in the programmable logic. In such embodiments, the NoC interconnect system may provide connectivity between the programmable interconnects and the first group of I/O interface circuits (or other I/O interface circuits for which the BLI does not provide connectivity to one or more portions of the programmable logic). In some aspects, one or more of the second group of I/O interface circuits may not have connectivity to the NoC interconnect system.

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus may represent any one or more of a myriad of physical or logical mechanisms for communication between components. The example embodiments are not to be construed as limited to specific examples described herein but rather to include within their scope all embodiments defined by the appended claims.

FIG. 1A shows a block diagram of an example programmable device 100A within which embodiments of the present disclosure may be implemented. In some embodiments, the device 100A may be formed on a single die. In other embodiments, the device 100A may be distributed across a plurality of dice. In addition, or in the alternative, the device 100A may be implemented as a System-on-a-Chip (SoC) including a number of subsystems capable of interacting with one another.

The device 100A may include a number of subsystems such as, for example, programmable logic (PL) 110, a network-on-chip (NoC) interconnect system 120, dedicated circuitry 130, a CCIX and PCIe Module (CPM) 140, connectivity fabric 145, transceivers 150, input/output (I/O) blocks 160, and memory controllers 170. In one or more embodiments, the device 100A may include other subsystems or components not shown in FIG. 1A. Further, although not shown for simplicity, the device 100A may be coupled to a number of peripheral components (such as one or more high-performance memory devices 195) and/or other devices or chips (such as another programmable device).

The PL 110 includes circuitry that may be programmed to perform a number of different user-defined functions or operations. In some embodiments, the PL 110 may include an array of programmable circuit blocks or tiles each including programmable interconnect circuitry and programmable logic circuitry. The programmable circuit blocks may include (but are not limited to) configurable logic blocks (CLBs), random access memory blocks (BRAM), digital signal processing blocks (DSPs), clock managers, delay lock loops (DLLs), and/or other logic or circuits that can be programmed or configured to implement a user-specified circuit design. In addition, or in the alternative, the PL 110 may include a number of input/output blocks (IOBs). In one or more embodiments, the PL 110 may be implemented as an array of programmable fabric sub-regions (FSRs) that can be distributed across the programmable fabric, for example, as described with respect to FIG. 5. In some aspects, the FSRs may be implemented as repeatable tiles within the programmable fabric.

The programmable interconnect circuitry may include a plurality of interconnect wires of varying lengths interconnected by programmable interconnect points (PIPs). The interconnect wires may be configured to provide connectivity between components within a particular programmable tile, between components within different programmable tiles, and between components of a programmable tile and other subsystems or devices. The programmable interconnect circuitry and the programmable circuit blocks may be programmed or configured by loading configuration data into configuration registers that define how the programmable elements are configured and operate to implement a corresponding user-specified circuit design. In some aspects, the programmable interconnect circuitry within each of a number of the programmable circuit blocks may form part of a programmable interconnect fabric that provides block-level and/or device-level signal routing resources for the device 100A.

Each CLB may include look-up tables (LUTs), flip-flops, combinational logic, and/or programmable interconnect circuitry that can be collectively programmed by the configuration data to perform various logic functions (such as addition and subtraction) on input signals of varying widths. The LUTs may be of any suitable size, and may include any suitable number of inputs and outputs. In some aspects, each CLB may include 32 LUTs and 64 flip-flops. Each of the CLBs may also include arithmetic carry logic and multiplexers that can be used to implement wider logic functions. In some embodiments, the resources of the PL 110 may be implemented as repeatable tiles arranged in columns in the programmable device 100A, and may be divided into a number of regions of a fixed height and width. For the example of FIG. 1A, the PL 110 is depicted as occupying different regions of the device 100A. In other embodiments, the PL 110 may be implemented as a unified region of programmable fabric.

The NoC interconnect system 120, which may be fabricated as part of the device 100A, provides a high-speed, high-bandwidth programmable signal routing network that may selectively interconnect the various resources, subsystems, circuits, and other components of the device 100A. In some embodiments, the NoC interconnect system 120 may extend in the horizontal and vertical directions across the programmable fabric (e.g., towards the edges) of the device 100A, as shown in FIG. 1A. In addition, or in the alternative, the NoC interconnect system 120 may extend in one or more diagonal directions across the programmable fabric. Further, although shown in the example of FIG. 1A as having a single columnar portion, in other embodiments, the NoC interconnect system 120 may include a plurality of columnar portions extending vertically across the height of the programmable fabric, for example, as described with respect to FIG. 5. Thus, the particular layout, shape, size, orientation, and other physical characteristics of the example NoC interconnect system 120 are merely illustrative of the various embodiments disclosed herein.

In some embodiments, the NoC interconnect system 120 may employ a data packet protocol and memory-mapped addresses to route information between the various resources, subsystems, circuits, and other components of the device 100A as packetized data. The data packets may include source addresses, destination addresses, and protocol information that can be used by the NoC interconnect system 120 to route the data packets to their indicated destinations. In one or more embodiments, the data packets may include Quality-of-Service (QoS) information that allows the transmission of data packets through the NoC interconnect system 120 to be prioritized, for example, based on assigned priorities, traffic types, and/or flow information. In such embodiments, the NoC interconnect system 120 may include priority logic that can determine priority levels or traffic classes of received data packets, and use the determined priority levels or traffic classes when queuing the data packets for transmission.

Although not shown for simplicity, the NoC interconnect system 120 may also include a scheduler and arbitration logic. The scheduler may be used to schedule the transmission of data packets from a source address to a destination address using one or more physical and/or virtual channels of the NoC interconnect system 120. The arbitration logic may be used to arbitrate access to the NoC interconnect system 120, for example, to minimize collisions and other contention-related latencies. For embodiments in which the device 100A is fabricated using stacked silicon interconnect (SSI) technology, the columnal portions of the NoC interconnect system 120 may provide signal connections between adjacent super logic regions (SLRs), for example, to allow configuration data to be routed between master and slave SLRs.

In some embodiments, the NoC interconnect system 120 may include a plurality of nodes, ports, or other interfaces (not shown for simplicity) that provide selective connectivity between the NoC interconnect system 120 and the various resources, subsystems, circuits, and other components of the device 100A. For example, the NoC interconnect system 120 may allow multiple subsystems of the device 100A to share access to on-chip memory (OCM) resources, processing resources, and/or I/O resources. By selectively interconnecting the various resources, subsystems, circuits, and other components of the device 100A that can demand and use large amounts of data, the NoC interconnect system 120 may alleviate signal routing burdens on local interconnect resources, thereby increasing device performance and allowing for greater configuration flexibility than other programmable devices. Moreover, by providing a high-performance signal routing network having higher data transmission rates and lower error rates than device-level and block-level programmable interconnects, the NoC interconnect system 120 may increase the processing power and data throughput of the device 100A (as compared to other programmable devices).

The dedicated circuitry 130 may include any suitable hard-wired circuits including (but not limited to) processors, serial transceivers, digital signal processors (DSPs), analog-to-digital converters (ADCs), digital-to-analog converters (DACs), device management resources, device monitoring resources, device testing management resources, and so on. In some embodiments, the dedicated circuitry 130 may include a processing system (PS) and a platform management controller (PMC), described with respect to FIG. 2. In some embodiments, the PS may include a number of processor cores, cache memory, and unidirectional and/or bidirectional interfaces configurable to couple directly to the I/O pins of the device 100A. In some aspects, each processor core may include central processing units (CPU) or scalar processors that can be used for sequential data processing. The PMC may be used for booting and configuring the device 100A based on configuration data (such as a configuration bitstream) provided from external memory. The PMC may also be used to configure the PL 110 and to control various encryption, authentication, system monitoring, and debug capabilities of the device 100A.

The CCIX and PCIe module (CPM) 140 may include a number of interfaces that provide connectivity between the device 100A and a number of peripheral components (such as external devices or chips). In some embodiments, the CPM 140 may include a number of peripheral interconnect express (PCIe) interfaces and cache coherent interconnect for accelerators (CCIX) interfaces that provide connectivity to other devices or chips via the transceivers 150. In some aspects, the PCIe and CCIX interfaces may be implemented as part of the transceivers 150. The CPM 140 is described with respect to FIG. 2.

The programmable interconnect fabric (not shown for simplicity) may provide block-level and/or device-level signal routing resources that can selectively interconnect circuits and subsystems in nearby regions of the programmable fabric based on configuration data loaded into corresponding configuration registers. In some embodiments, the programmable interconnect fabric may include a plurality of fabric sub-regions (FSRs) that can be implemented as repeatable tiles and distributed across the device 100A. In some aspects, the FSRs may include portions of the programmable interconnect elements associated with the various programmable logic circuits (such as CLBs, DSPs, and BRAM) of the PL 110.

The transceivers 150 may provide signal connections with one or more other devices or chips (not shown for simplicity) connected to the device 100A. The transceivers 150 may include a number of different serial transceivers such as, for example, gigabit serial transceivers. In some embodiments, the transceivers 150 may be implemented as a number of repeatable tiles positioned in various locations along the right and left sides of the device 100A, as depicted in FIG. 1A. In other embodiments, the transceivers 150 may be positioned in other suitable locations of the device 100A.

The I/O blocks 160 are coupled to the device's I/O pins (not shown for simplicity), and may provide I/O capabilities for the device 100A. For example, the I/O blocks 160 may receive data from one or more other devices, and may drive the received data to a number of destinations in the device 100A. The I/O blocks 160 may also receive data from a number of sources in the device 100A, and may drive the received data to one or more other devices via the device's I/O pins. In some embodiments, the I/O blocks 160 may be implemented as repeatable tiles. The device 100A may include any suitable number of I/O blocks 160, and therefore the example embodiment depicted in FIG. 1A is merely illustrative.

The I/O blocks 160 may include any number of suitable I/O circuits or devices. In some embodiments, the I/O blocks 160 may include extremely high-performance I/O (XPIO) circuits, high-density I/O (HDIO) circuits, and multiplexed I/O (MIO) circuits. The XPIO circuits may be optimized for high-performance communications such as providing a high-speed, low latency interface to the memory controllers 170. The HDIO circuits may provide a cost-effective solution that supports lower speed and higher voltage I/O capabilities (as compared with the XPIO circuits). The MIO circuits may provide general-purpose I/O resources that can be accessed by various subsystems such as, for example, the PL 110, the dedicated circuitry 130, and the CPM 140.

In some embodiments, a first row of I/O blocks 160 may be implemented as repeatable tiles positioned along a bottom edge of the device 100A, and a second row of I/O blocks 160 may be implemented as repeatable tiles positioned along a top edge of the device 100A. In some aspects, the repeatable tiles that implement the I/O blocks 160 may be different from one another. For example, some I/O blocks 160 may implement XPIO circuits, other I/O blocks 160 may implement HDIO circuits, and other I/O blocks 160 may implement MIO circuits.

The memory controllers 170 may be used to control access to various memory resources provided within and/or external to the device 100A. The memory controllers 170 may include double data rate v4 (DDR4) memory controllers, double data rate v5 (DDR5) memory controllers, high bandwidth memory (HBM) controllers, and/or other suitable memory controllers. In one or more embodiments, some or all of the memory controllers 170 may include a scheduler having transaction reordering capabilities that may improve memory access efficiency.

In some embodiments, a first row of memory controllers 170 may be implemented as repeatable tiles positioned along the bottom edge of the device 100A, and a second row of memory controllers 170 may be implemented as repeatable tiles positioned along the top edge of the device 100A. In some aspects, the repeatable tiles that implement the memory controllers 170 may be different from one another. For example, a first number of the memory controllers 170 may implement DDR4 memory controllers, a second number of the memory controllers 170 may implement LPDDR4 memory controllers, and a third number of the memory controllers 170 may implement HBM controllers. The repeatable tiles that implement the I/O blocks 160 and memory controllers 170 may be alternately positioned or distributed relative to each other, for example, as depicted in the example of FIG. 1A. The device 100A may include any number of the I/O blocks 160 and memory controllers 170, and therefore the numbers and positions of the I/O blocks 160 and memory controllers 170 depicted in FIG. 1A are merely illustrative.

Although not shown in FIG. 1A for simplicity, the device 100A may include a Boundary Logic Interface (BLI) that provides connectivity between the I/O blocks 160 and programmable interconnects provided within the PL 110. In some aspects, the BLI may allow large and complex external devices (such as HBM) to appear as much smaller blocks (such as a CLB) in the programmable fabric of the device 100A. In some embodiments, the BLI may be arranged in rows positioned at the top and bottom boundaries or edges of the programmable fabric. In this manner, the BLI may be used to route signals between columnar logic structures (such as a CLB column or a DSP column) and rows of I/O resources (such as the I/O blocks 160).

Figure 1B:
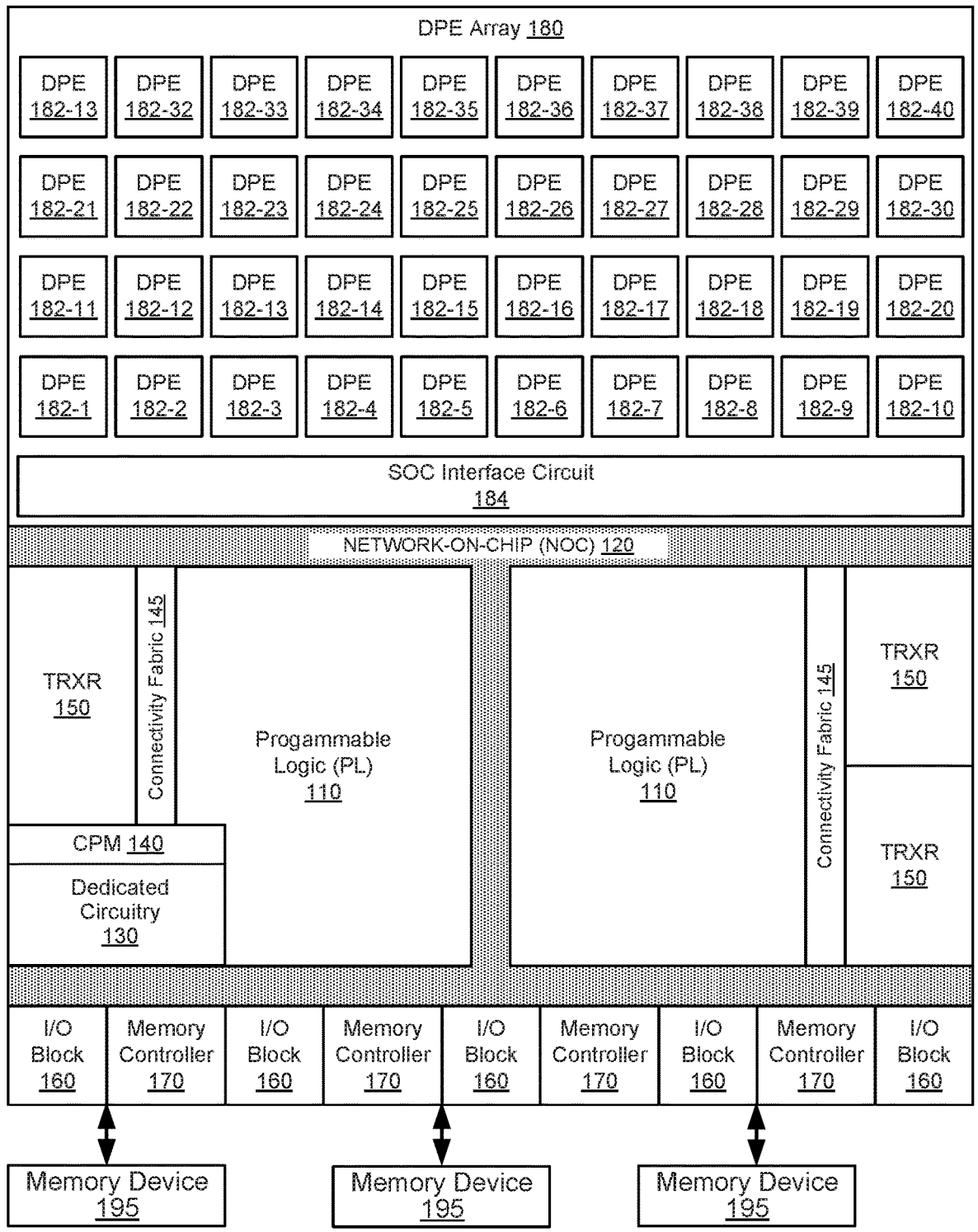
FIG. 1B shows a block diagram of another example programmable device within which embodiments of the present disclosure may be implemented.

FIG. 1B shows a block diagram of another example programmable device 100B within which embodiments of the present disclosure can be implemented. The device 100B is similar to the device 100A of FIG. 1A except, for example, that the row of I/O blocks 160 and memory controllers 170 positioned along the top of the device 100A of FIG. 1A is occupied by a data processing engine (DPE) array 180 in the device 100B of FIG. 1B.

The DPE array 180 may include processing resources having artificial intelligence (AI) and/or machine learning (ML) capabilities useful for a variety of applications including (but not limited to) data centers, wired networks, 5G wireless communications, automotive driver assistance. In some embodiments, the DPE array 180 may include a plurality of DPEs 182-1 to 182-40 and a System-on-Chip (SoC) interface circuit 184. The plurality of DPEs 182-1 to 182-40 may be collectively referred to herein as DPEs 182, and may be individually referred to herein as a DPE 182. The DPEs 182 may be hardwired circuit blocks that can be independently programmable to perform one or more functions. Although not shown in FIG. 1B for simplicity, each DPE 182 may include one or more processor cores, a memory module, and a plurality of DPE interconnects. The one or more processing cores provide data processing capabilities, and may include vector processors and scalar processors. The memory module may be accessible by the one or more processor cores, and may also be accessible by the processor cores in a number of other DPEs 182. The DPE interconnects include circuitry (such as signal lines and switches) that can provide programmable signal routing within the DPE 182, programmable signal routing with one or more other DPEs 182, and programmable signal routing with subsystems and circuits external to the DPE array 180. In some embodiments, the DPE interconnects collectively form a DPE interconnect network that can be programmed to provide signal interconnections between various components of the DPE array 180 as well as between the DPE array 180 and other circuits and subsystems of the device 100B via the SOC interface block 184. The DPE interconnect network may also be used to route configuration data to various configuration registers within the DPE array 180, for example, to configure the DPE array 180 to perform a number of functions or operations selected by the user.

In some embodiments, the DPE array 180 may be configured to implement a digital signal processing (DSP) architecture that can perform a multitude of different operations including (but are not limited to) operations relating to wireless radio, decision feedback equalization (DFE), 5G/baseband, wireless backhaul, machine learning, automotive driver assistance, embedded vision, cable access, and/or radar. In addition, or in the alternative, the DPE array 180 may be configured to implement a central processing unit (CPU) and/or a graphics processing unit (GPU).

The DPE array 180 may include any suitable number of DPEs 182, may be organized in any suitable manner, and may be positioned in any suitable location in the device 100B. For the example of FIG. 1B, the DPE array 180 is implemented in a top region of the device 100B, and the DPEs 182 are organized in rows and columns, with the DPEs 182 in each column aligned with each other and the DPEs 182 in each row aligned with each other. In other embodiments, the DPE array 180 may be implemented in another region of the device 100B (or distributed across multiple locations of the device 100B), and the DPEs 182 may be organized in other numbers of rows and columns or may be organized using other suitable architectures. Thus, the placement, size, and layout of the DPE array 180 in FIG. 1B is merely illustrative.

The DPEs 182 may be implemented as repeatable tiles within the DPE array 180. In some embodiments, the DPE array 180 may be implemented as a homogeneous structure such that all of the DPEs 182 are the same. In other embodiments, the DPE array 180 may be implemented as a heterogeneous structure such that the DPE array 180 includes two or more different types of DPEs 182. For example, some DPEs 182 may include a single processing core, while other DPEs 182 may include a plurality of processing cores.

The SoC interface circuit 184 may provide programmable signal routing between the DPE array 182 and a number of other subsystems and circuits of the device 100B by the NoC interconnect system 120. In some embodiments, the SoC interface circuit 184 may include one or more individually programmable hardwired tiles. In some aspects, the SoC interface circuit 184 may be coupled to adjacent DPEs 182 in the DPE array 180. In other aspects, the SoC interface circuit 184 may be located at the top of the DPE array 180, to the left or to the right of the DPE array 180 (such as in a column), or in multiple positions distributed across the DPE array 180 (such as in one or more intervening rows and/or columns within the DPE array 180).

The SoC interface circuit 184 may establish signal connections between each of the DPEs 182 within the DPE array 180 and one or more other subsystems such as, for example, the NoC interconnect system 120 and the PL 110. In some embodiments, the SoC interface circuit 184 may be coupled directly to the NoC interconnect system 120, to the PL 110, to the dedicated circuitry 130, and/or to one or more other subsystems of the device 100B.

Figure 2:
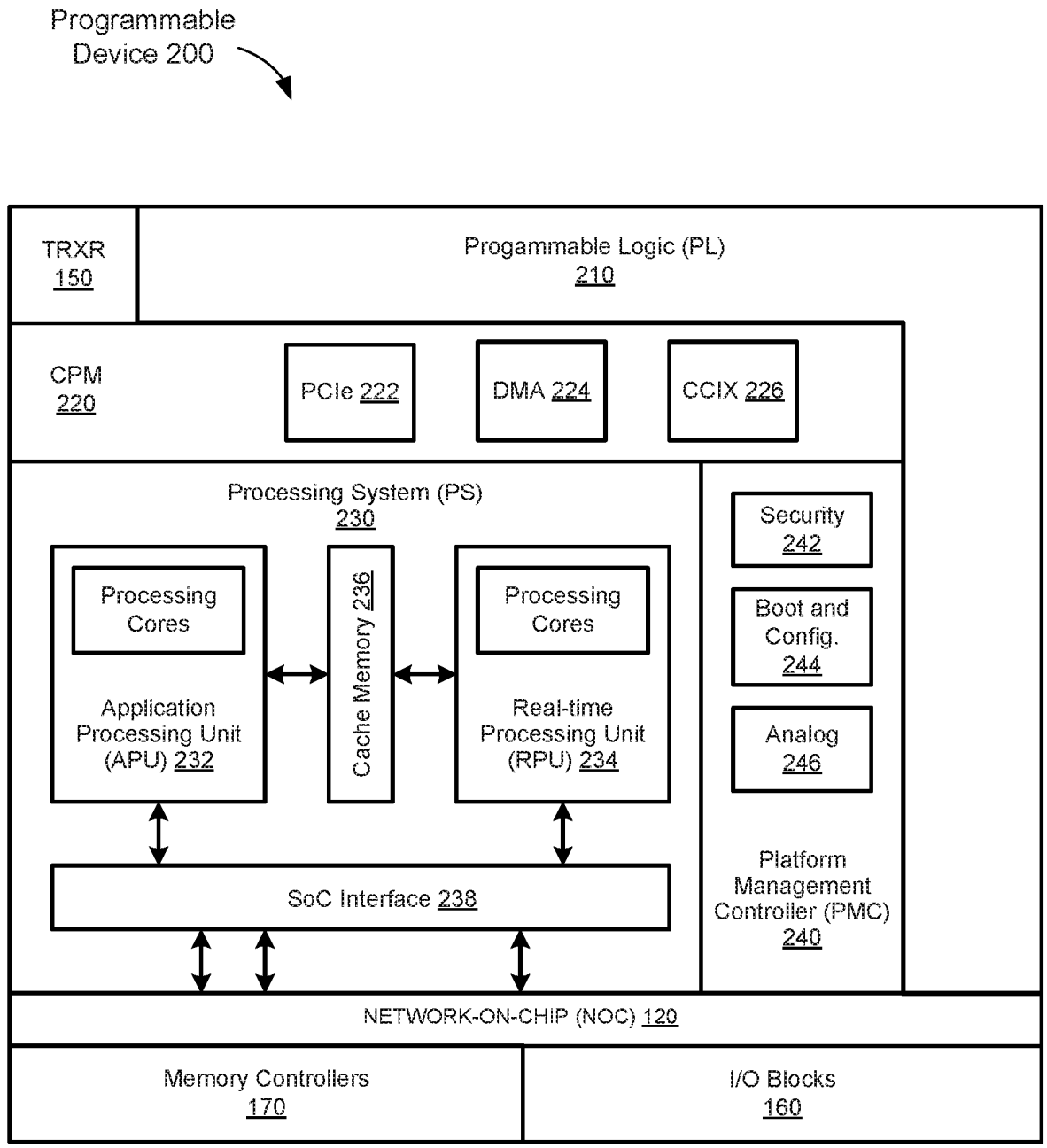
FIG. 2 shows a block diagram of a portion of the programmable devices of FIGS. 1A and 1B in accordance with some embodiments.

FIG. 2 shows a functional block diagram of a programmable device 200 that may be one implementation of the programmable device 100B of FIG. 1B, in accordance with some embodiments. In addition to the transceivers 150, I/O blocks 160, and memory controllers 170 described above with respect to FIGS. 1A and 1B, the portion of device 200 shown in FIG. 2 includes programmable logic (PL) 210, a CPM 220, a processing system (PS) 230, and a platform management controller (PMC) 240. It is to be noted that the example of FIG. 2 is illustrative of various aspects of the programmable device 200, and that the sizes, shapes, and locations of the components depicted in FIG. 2 are not drawn to scale and may not be representative of the physical aspects of such components in actual embodiments. In addition, some components of the programmable device 200 (such as MIOs, XPIOs, AXI circuits, and so on) are not shown in FIG. 2 for simplicity. The PL 210, which may be one implementation of the PL 110 of FIG. 1B, may be adjacent to and directly connected to the transceivers 150, the CPM 220, the PMC 240, and the NoC interconnect system 120.

The CPM 220 may provide interfacing capabilities for a number of different bus standards. In some embodiments, the CPM 220 may include a peripheral component interconnect express (PCIe) interface 222, a direct memory access (DMA) circuit 224, and a cache coherent interconnect for accelerators (CCIX) interface 226. The PCIe interface 222 may be used to exchange data between the PS 230 and one or more other devices or chips via the transceivers 150 according to a PCI protocol. Similarly, the CCIX interface 226 may be used to exchange data between the PS 230 and one or more other devices or chips via the transceivers 150 according to a CCIX protocol. In some embodiments, the CPM 220 may also exchange data with other components of the device 200 using the NoC interconnect system 120. Thus, although FIG. 2 may not depict connections between the CPM 220 and the NoC interconnect system 120, in actual embodiments, the CPM 220 may be adjacent to and/or coupled directly to the NoC interconnect system 120.

The PS 230 may provide dedicated data processing capabilities for the device 200, and is shown to include an application processing unit (APU) 232, a real-time processing unit (RPU) 234, cache memory 236, and a system-on-a-chip (SoC) 238. Although not shown for simplicity, the PS 230 may also include peripherals for communication standards (such as Ethernet and USB 2.0 interfaces) and various controllers (such as SPI, I2C, UART, and CAN-FD controllers). The APU 232 and the RPU 234 may each include one or more processing cores (such as CPUs) that can provide dedicated scalar processing capabilities for the device 200. Referring also to FIG. 1B, the PS 230 may be selectively connected to other subsystems of the device 200 by the programmable interconnect fabric and the NoC interconnect system 120.

In some embodiments, the APU 232 may include a multi-core ARM processor that supports hardware virtualization, and may have a built-in interrupt controller and snoop control unit. The interrupt controller may support virtual interrupts, and the snoop control unit may be used maintain coherency between one or more caches used and/or shared by APU 232 and RPU 234. The APU 232 may communicate with other components of the PS 230 using an AXI coherent extension (ACE) port, and may communicate with the PL 210 using an accelerator coherency port (ACP). In some embodiments, the RPU 234 may include a multi-core ARM processor that supports real-time data processing, may include tightly coupled memory (TCM) interface for real-time single cycle access, and may have a dedicated interrupt controller and floating point unit. The RPU 234 may communicate with other components of the PS 230 and/or with the PL 210 using AXI ports.

The cache memory 236 may be any suitable high-speed cache that allows for shared access by the APU 232 and the RPU 234. The SoC Interface 238 may provide connectivity between various resources of the PS 230 and the NoC interconnect system 120.

The PMC 240 may include security circuitry 242, booting and reconfiguration circuitry 244, and analog circuitry 246. The security circuitry 242 may provide data encryption/decryption capabilities and other security features. The booting and reconfiguration circuitry 244 may provide a multi-stage boot process that supports both a non-secure and a secure boot. The analog circuitry 246 may include any suitable analog circuit components. Further, although not shown in FIG. 2 for simplicity, the PMC 240 may include system monitoring resources, debugging capabilities (such as JTAG circuitry), external flash memory interfaces, and other components or circuits. In some embodiments, the PMC 240 may allow portions of the PL 210 to be reconfigured using a partial reconfiguration operation. For example, a new configuration bitstream for a portion of the PL 210 can be loaded from the PS 230 via either a primary or secondary boot interface (such as PCIe or Ethernet), and then stored in configuration registers associated with the portions of the PL 210 to be reconfigured. The ability to allow for partial reconfiguration of one or more portions of the PL 210 may allow the user to more quickly reconfigure the device 200 to reflect changes or updates to the user-specified circuit design (such as compared with other programmable devices).

Figure 3:
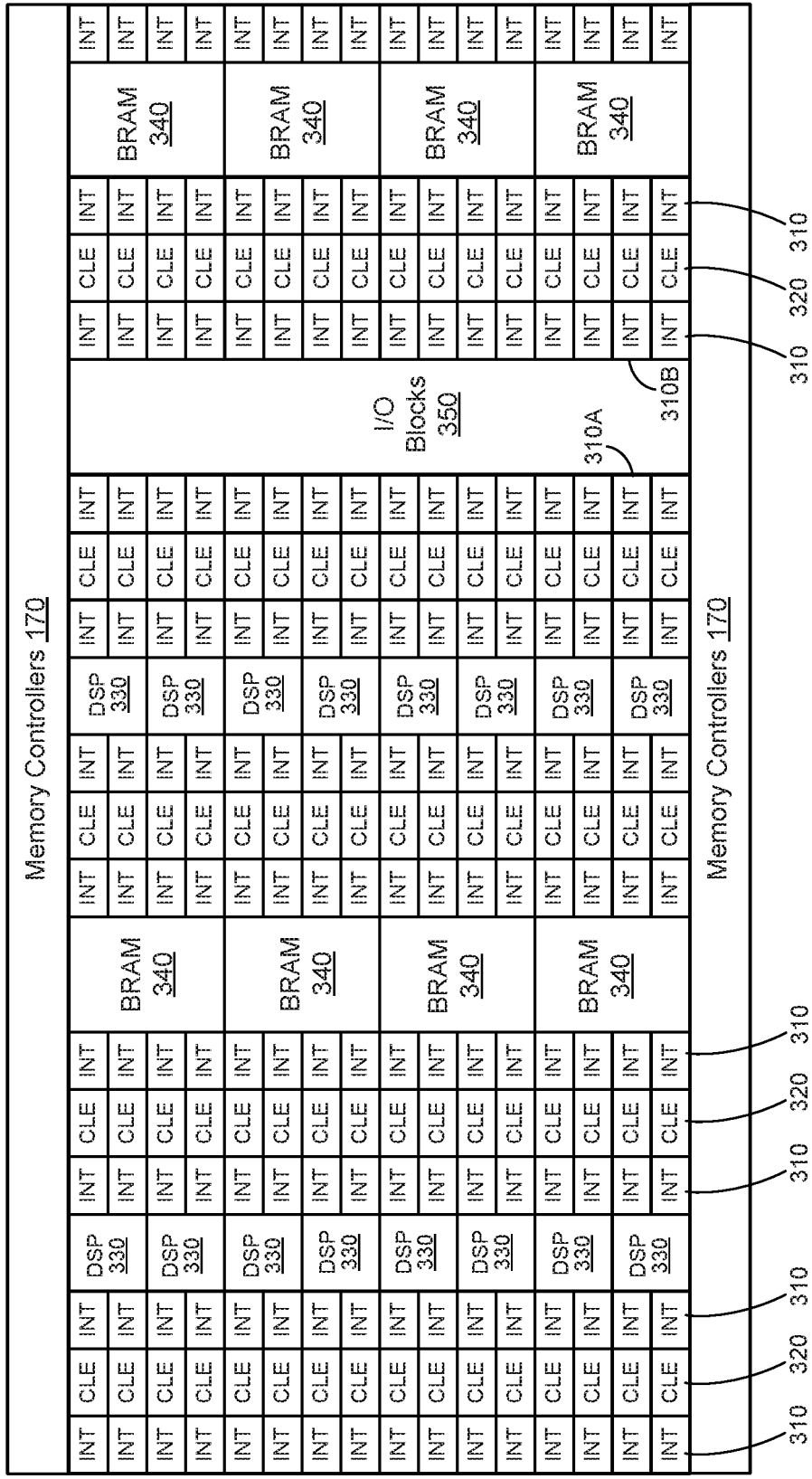
FIG. 3 shows a block diagram of an example programmable fabric including a columnar input/output (I/O) block.

Positioning the I/O blocks 160 along the bottom edges of devices 100A, 1668, and 200 may provide several advantages over programmable device architectures in which the I/O blocks are arranged in one or more columns located in the middle of the programmable fabric. For example, FIG. 3 shows a block diagram of an example programmable fabric 300 including columnar input/output (I/O) resources. The programmable fabric 300 is shown to include a plurality of different programmable circuit blocks or tiles that can be arranged in columns. The programmable circuit blocks may include (but are not limited to) programmable interconnect elements (INT) 310, configurable logic elements (CLEs) 320, DSPs 330, block RAMs (BRAMs) 340, and I/O blocks 350 arranged in a columnar architecture. For the example of FIG. 3, the programmable fabric 300 is shown to include eleven columns of programmable interconnect elements 310, five columns of CLEs 320, two columns of DSPs 330, two columns of BRAM 340, and one column of I/O blocks 350. In other embodiments, the programmable fabric 300 may include other numbers of columns of programmable interconnect elements 310, CLEs 320, DSPs 330, BRAMs 340, and I/O blocks 350. The programmable fabric 300 may also include a number of other subsystems or components not shown in FIG. 3 for simplicity (such as processing cores, programmable interconnect structures, and the like).

The programmable interconnect elements 310, the CLEs 320, the DSPs 330, and the BRAM 340 may be implemented as tiles that can be repeated across the programmable fabric 300. Each of the tiles may include at least one programmable interconnect element 310 that provides local signal interconnections to a programmable logic element within the same tile, that provides local signal interconnections to programmable interconnect elements 310 within adjacent tiles, and/or that provides local signal interconnections to other signal routing resources. The programmable interconnect elements 310 may collectively form at least a portion of the programmable interconnect fabric (or another suitable device-level signal routing structure).

In some embodiments, a configurable logic block (CLB) may include a programmable interconnect element 310 coupled to a CLE 320 that can be programmed to implement various user-specified functions or operations. Similarly, a BRAM 340 may include a BRAM logic element and one or more programmable interconnect elements 310, and an I/O block 350 may include multiple instances of an input/output logic element (IOL) and one or more programmable interconnect elements 310.

The columnar I/O block 350 may include a plurality of individual I/O blocks that provide signal connections between the programmable fabric 300 and the device's I/O pins (not shown for simplicity). The individual I/O blocks (not shown for simplicity) that form the I/O block 350 may be implemented as tiles that can be repeated in a columnar architecture. The tiles that form the columnal I/O block 350 may implement any suitable I/O circuitry such as, for example, HPIO, HDIO, and MIO circuits.

As depicted in the example of FIG. 3, the columnal I/O block 350 spans the height of the programmable fabric 300, and slices through a number of programmable interconnect elements 310 and CLEs 320. Positioning the columnal I/O block 350 in this manner results in a "gap" in the programmable fabric 300, for example, such that the programmable interconnect elements 310A and 310B (positioned to the left and right, respectively, of the columnal I/O block 350) may not be connected to each other using local signal interconnects. Metal traces (not shown for simplicity) that span across the gap associated with the columnal I/O block 350 may be used to provide direct connections between the programmable interconnect elements 310A and 310B (and other portions of the programmable fabric 300 positioned on either side of the columnal I/O block 350). These metal traces may have greater series resistance and signal propagation delays than the local signal interconnects between adjacent programmable interconnects 310, which may adversely affect performance.

The gap associated with the columnal I/O block 350 may be eliminated by replacing the columnal I/O block 350 with one or more rows of I/O blocks or circuits positioned along the bottom and/or the top of the programmable fabric 300, for example, as depicted in FIGS. 1A and 1B. Such an arrangement may allow for a more unified and less partitioned programmable fabric that eliminates the need for metal traces spanning across the columnal I/O block 350 and other columnar structures that disrupt the regularity of an otherwise homogenous programmable logic architecture. In addition, relocating the resources of the I/O block 350 to rows positioned along the bottom and/or top edges of the programmable fabric may also allow the use of shorter signal wires or traces that connect various elements of the programmable fabric to each other. In this manner, latencies associated with routing signals between different portions of the programmable fabric may be reduced.

Figure 4A:
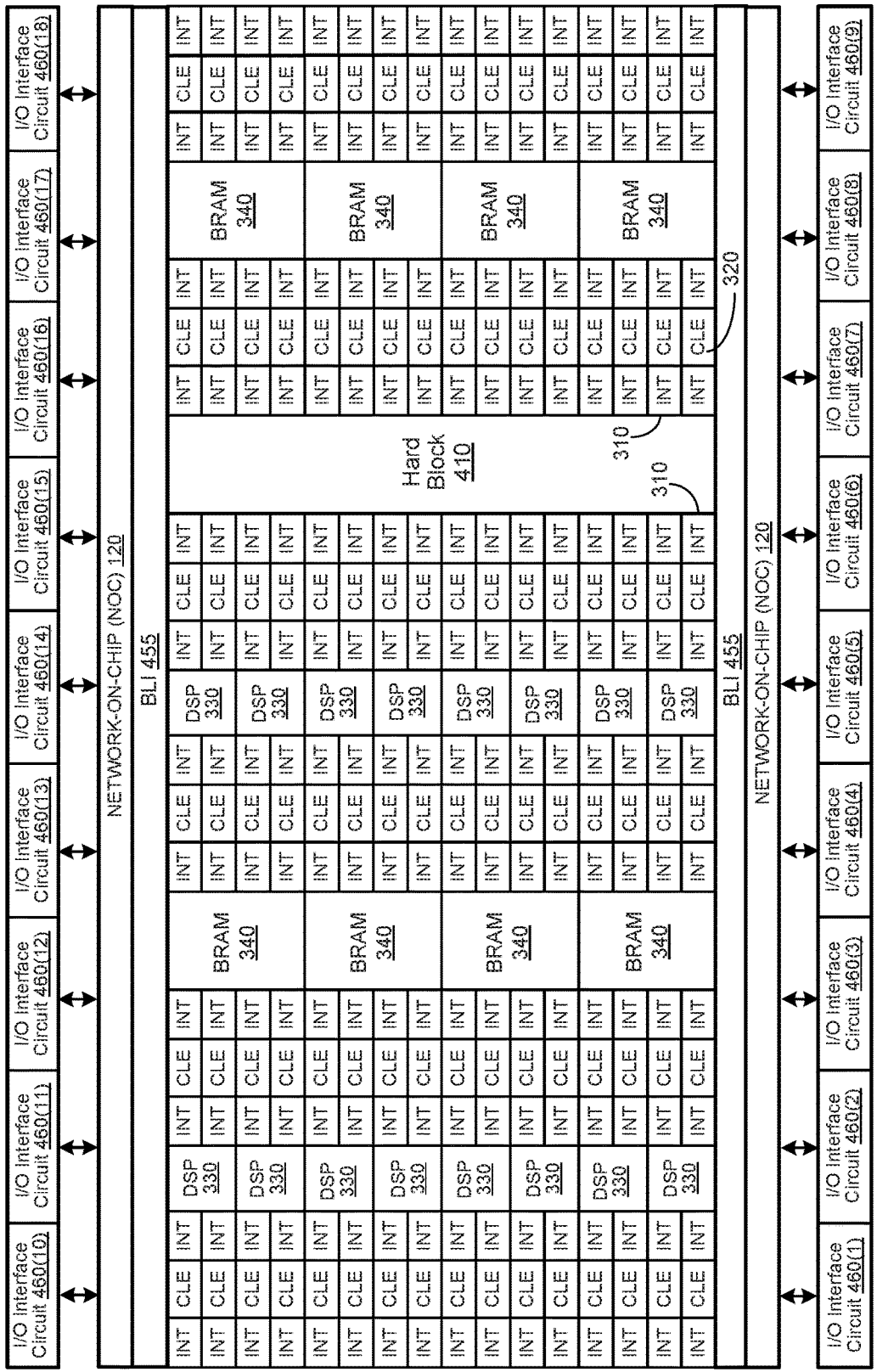
FIG. 4A shows a block diagram of an example programmable fabric including rows of input/output (I/O) interface circuits, in accordance with some embodiments.

FIG. 4A shows a block diagram of an example programmable fabric 400A including rows of input/output (I/O) resources in accordance with some embodiments. The programmable fabric 400A, which may be one implementation of the programmable fabric of the device 100A of FIG. 1A, includes a plurality of different programmable circuit blocks that can be implemented as repeatable tiles arranged in columns. The programmable circuit blocks may include (but are not limited to) the programmable interconnect elements (INT) 310, CLEs 320, DSPs 330, and BRAM 340 described above with respect to FIG. 3. In other embodiments, the programmable fabric 400A may include other subsystems or components not shown in FIG. 4A.

The programmable fabric 400A may include a columnar hard block 410 that extends vertically across the height of the programmable fabric 400A. The hard block 410 may include a number of hard-wired circuits such as, for example, USB controllers, Ethernet MACs, multi-rate (MR) Ethernet MACs, PCIe controllers, and CCIX controllers. In some aspects, the hard block 410 may include various circuits and components that implement the Physical Layer, the Data Link Layer, and the Transaction Layer of the PCIe protocol. In other embodiments, the columnar hard block 410 may include additional circuits or components.

The programmable fabric 400A may include or may be coupled to I/O resources that provide programmable signal connections between the device's I/O pins and various circuit blocks, subsystems, and other components of the programmable fabric 400A. The I/O resources may include a plurality of I/O interface circuits 460(1)-460(18) positioned along the perimeter of the programmable fabric 400A. The I/O interface circuits 460(1)-460(18), which may be collectively referred to herein as the I/O interface circuits 460, may be used to selectively connect the device's I/O pins to various circuits, blocks, subsystems, and other components of the programmable fabric 400A using the programmable interconnect fabric and/or the NoC interconnect system 120. In some embodiments, the I/O interface circuits 460 may perform the functions of the I/O blocks 160 and memory controllers 170 of the programmable device 100A of FIG. 1A and/or the programmable device 100B of FIG. 1B.

For the example embodiment of FIG. 4A, a first row of I/O interface circuits 460(1)-460(9) is positioned along the bottom edge of the programmable fabric 400A, and a second row of I/O interface circuits 460(10)-460(18) is positioned along the top edge of the programmable fabric 400A. In some embodiments, the I/O interface circuits 460 may be implemented as repeatable tiles arranged in one or more rows, as shown in FIG. 4A. In other embodiments, the I/O interface circuits 460 may be implemented as repeatable tiles arranged in one or more columns. Although shown to include eighteen I/O interface circuits 460(1)-460(18) in the example of FIG. 4A, the programmable devices disclosed herein may include any suitable number of I/O interface circuits 460, which may be arranged in any suitable number of rows (and/or columns) of various heights, widths, or lengths.

A boundary logic interface (BLI) 455 may provide programmable signal interconnections between columns of programmable resources (such columns of programmable interconnect elements and columns of CLEs) and rows of I/O resources (such as the I/O interface circuits 460). In some embodiments, the BLI 455 may allow large and complex external devices (such as HBM) to appear as much smaller blocks (such as a CLB) in the programmable fabric 400A. The BLI 455 may be implemented as repeatable tiles arranged in one or more rows positioned along the lower and/or upper boundaries of the programmable fabric 400A, for example, to provide connectivity interface between the programmable interconnect fabric (such as the INTs 310) and rows of I/O interface circuits 460. In some embodiments, the lower row of the BLI 455 may be configured to selectively route data between the columnar logic and interconnect structures of the programmable fabric 400A and the lower row of I/O interface circuits 460(1)-460(9) positioned along a lower boundary of the programmable fabric 400A, and the upper row of the BLI 455 may be configured to selectively route data between the columnar logic and interconnect structures of the programmable fabric 400A and the upper row of I/O interface circuits 460(10)-460(18) positioned along an upper boundary of the programmable fabric 400A. In this manner, the BLI 455 may provide a connectivity interface between the programmable interconnect elements 310 (and other routing resources not shown for simplicity) of the programmable fabric 400A and the rows of I/O interface circuits 460.

Although the lower row of the BLI 455 and the upper row of the BLI 455 are each depicted in the example of FIG. 4A as extending across an entire width of the programmable fabric 400A, in actual embodiments, the lower and/or upper rows of the BLI 455 may not extend across the entire width of the programmable fabric 400A. Further, it is noted that each of the lower and upper rows of the BLI 455 may displace one or more rows (or partial rows) of INTs 310, CLEs 320, DSPs 330, and BRAMs 340 associated with the programmable fabric 400A. Thus, in some aspects, shortening a respective row of the BLI 455 (such that the respective row does not extend across the entire width of the programmable fabric 400A) may allow the programmable fabric 400A to include a number of additional INTs 310, CLEs 320, DSPs 330, and/or BRAMs 340.

In accordance with some aspects of the present disclosure, each of the I/O interface circuits 460 may include an I/O circuit that provides connectivity between a corresponding set of device I/O pins and the programmable fabric 400A via the BLI 455, and may include a memory controller that provides connectivity between the corresponding set of device I/O pins and the programmable fabric 400A via the NoC interconnect system 120. In some embodiments, the memory controller may be compatible with a data packet protocol used by the NoC interconnect system 120, for example, so that each of the I/O interface circuits 460 can transmit data packets to (and receive data packets from) the NoC interconnect system 120. In this manner, the memory controllers provided within the I/O interface circuits 460 may obviate a need for additional or dedicated circuitry to convert packetized data to non-packetized data (e.g., when receiving data packets from the NoC interconnect system 120) and to convert non-packetized data to packetized data (e.g., when transmitting data packets to the NoC interconnect system 120).

In some embodiments, the I/O interface circuits 460 may receive configuration data indicating whether each of the I/O interface circuits 460 is configured to operate according to a data packet protocol or according to a non-packetized data protocol. For example, a respective one of the I/O interface circuits 460 may be configured to provide connectively between the device I/O pins and the NoC interconnect system 120 (e.g., by operating according to the data packet protocol) based on a first value of an associated configuration bit, and may be configured to provide connectively between the device I/O pins and the programmable interconnect fabric (e.g., by operating according to the non-packetized data packet protocol) based on a second value of the associated configuration bit. In some aspects, the BLI 455 may also receive configuration data indicating whether the BLI 455 is to exchange information with a respective one of the I/O interface circuits 460 using packetized data or non-packetized data.

Figure 4B:
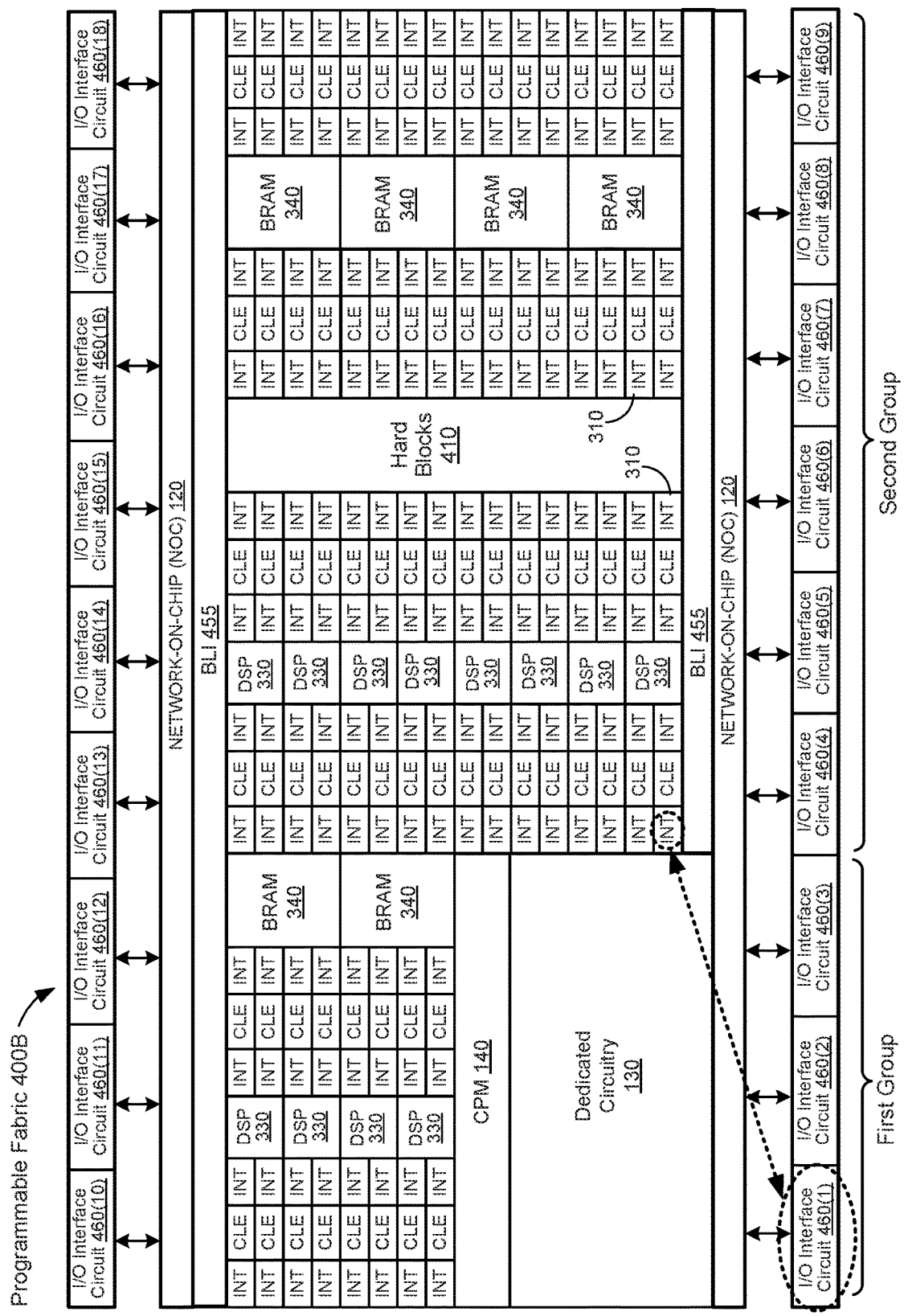
FIG. 4B shows a block diagram of another example programmable fabric including rows of I/O interface circuits, in accordance with some embodiments.

FIG. 4B shows a block diagram of another example programmable fabric 400B including rows of I/O interface circuits 460, in accordance with some embodiments. The programmable fabric 400E is similar to the programmable fabric 400A of FIG. 4A except, for example, that a lower boundary region of the programmable logic of FIG. 4B is occupied by the dedicated circuitry 130 and the CPM 140, rather than by programmable interconnect elements 310 and CLEs 320. Also, in contrast to the example of FIG. 4A, the programmable fabric 400B of FIG. 4B includes a lower BLI 455 that terminates in the dedicated circuitry 130, for example, such that the lower BLI 455 does not extend beneath the dedicated circuitry 130. Further, although shown to include eighteen I/O interface circuits 460(1)-460(18) in the example of FIG. 4A, the programmable devices disclosed herein may include any suitable number of I/O interface circuits 460, which may be arranged in any suitable number of rows (and/or columns) of various heights, widths, or lengths.

Although the dedicated circuitry 130 and the CPM 140 may increase the processing and device management capabilities of the programmable fabric 400B (as compared to the programmable fabric 400A of FIG. 4A), positioning the dedicated circuitry 130 (and the CPM 140) in a lower boundary region of the programmable fabric 400B disrupts the regular columnar architecture that defines large portions of the programmable fabric 400A within which INTs and other aspects of a device-level interconnect system may be implemented. More specifically, there may be an absence of programmable interconnect elements 310 in the lower boundary region of the programmable fabric 400B that is occupied by the dedicated circuitry 130 and CPM 140, for example, because such programmable interconnect elements 310 are displaced by at least the dedicated circuitry 130. As a result, the programmable fabric 400B may not include enough programmable interconnect elements 310 to provide connectivity for all of the I/O interface circuits 460, particularly for the I/O interface circuits 460(1)-460(3) positioned below the dedicated circuitry 130 and CPM 140.

In accordance with various embodiments of the present disclosure, the resulting oversubscription of programmable interconnect resources (and BLI resources) may be alleviated by using the NoC interconnect system 120 to supplement the I/O connectivity provided by the device-level interconnect system formed at least in part by the programmable interconnect elements (INTs) 310 and the BLI 455. In some embodiments, one or more of the I/O interface circuits 460 without connectivity to the programmable fabric 400B via the BLI 455 may be identified for access to the NoC interconnect system 120. The one or more identified I/O interface circuits 460 may be selectively connected to ports of the NoC interconnect system 120 to facilitate connectivity to the programmable fabric 400A using the NoC interconnect system 120. In some aspects, the one or more identified I/O interface circuits 460 may be configured for transmitting and receiving packetized data according to the same data packet protocol used by the NoC interconnect system 120. In this manner, the one or more identified I/O interface circuits 460 may use the NoC interconnect system 120, rather than device-level signal interconnect structures (such as the programmable interconnect fabric), to exchange data with various components in the programmable fabric 400B. The other, non-identified I/O interface circuits 460 may be connected to the programmable interconnect fabric via the BLI 455. In some aspects, the non-identified I/O interface circuits 460 may be configured for transmitting non-packetized data compatible with the programmable interconnect fabric.

Although the upper row of the BLI 455 is depicted in the example of FIG. 4B as extending across an entire width of the programmable fabric 400B, in actual embodiments, the upper row of the BLI 455 may not extend across the entire width of the programmable fabric 400B. Further, it is noted that each of the lower and upper rows of the BLI 455 may displace one or more rows (or partial rows) of INTs 310, CLEs 320, DSPs 330, and BRAMs 340 associated with the programmable fabric 400B. Thus, in some aspects, shortening the upper row of the BLI 455 (such that the upper row does not extend across the entire width of the programmable fabric 400B) may allow the programmable fabric 400B to include a number of additional INTs 310, CLEs 320, DSPs 330, and/or BRAMs 340.

Although not shown in FIG. 4B for simplicity, serial transceivers (such as the serial transceivers 150 of FIGS. 1A and 1B) positioned in a lower boundary region of the programmable fabric 400B may also disrupt the regular columnar architecture that defines large portions of the programmable fabric 400B, for example, such that there may be an absence of programmable interconnect elements 310 in the lower boundary region of the programmable fabric 400B that is occupied by the serial transceivers. As a result, the programmable fabric 400B may not include enough programmable interconnect elements 310 to provide connectivity for all of the I/O interface circuits 460, particularly for the I/O interface circuits 460 positioned below the serial transceivers.

In some embodiments, a respective one of the I/O interface circuits 460 may be identified for access to the NoC interconnect system 120 based at least in part on a distance between the respective I/O interface circuit 460 and a nearest programmable interconnect element 310. In some aspects, the distance between each of the I/O interface circuits 460 and a corresponding nearest programmable interconnect element 310 may be compared with a reference value to identify a first group of I/O interface circuits 460 that may be configured to access to the NoC interconnect system 120 for connectivity to the programmable fabric 400B. The first group may include the I/O interface circuits 460 for which their respective distances to the nearest programmable interconnect element 310 is greater than the reference value, and a second group of I/O interface circuits 460 may include the other I/O interface circuits 460 (e.g., the I/O interface circuits 460 for which their respective distances to the nearest programmable interconnect element 310 is not greater than the reference value). For the example of FIG. 4B, a first group of the I/O interface circuits 460(1)-460(3) are positioned below the programmable logic region containing the dedicated circuitry 130, for example, where there is an absence of programmable interconnect elements 310. The distances between I/O interface circuits 460(1)-460(3) and the nearest programmable interconnect elements 310 may be greater than corresponding distances between each of the other I/O interface circuits 460(4)-460(18) and their respective nearest programmable interconnect elements 310. As such, signal propagation delays, timing errors, data loss, and routing complexities associated with providing connectivity to the first group of I/O interface circuits 460(1)-460(3) via the BLI 455 and programmable interconnects may be much greater than the signal propagation delays, timing errors, data loss, and routing complexities associated with providing connectivity to the second group of I/O interface circuits 460(4)-460(18).

As another example, in some aspects, the distance between I/O interface circuit 460(1) and the programmable interconnect element 310A (both circled in FIG. 4B) may be greater than the distances between the other I/O interface circuits 460(2)-460(18) and their respective nearest programmable interconnect elements 310, and thus I/O interface circuit 460(1) may be the first of the I/O interface circuits 460 to be identified for providing connectivity to the programmable fabric 400B via the NoC interconnect system 120. Similarly, if the distance between I/O interface circuit 460(2) and its nearest programmable interconnect element 310 is greater than corresponding distances associated with the non-identified I/O interface circuits 460(3)-460(18), then I/O interface circuit 460(2) may be the second of the I/O interface circuits 460 to be identified for providing connectivity to the programmable fabric 400B via the NoC interconnect system 120. This process may continue until the signal routing needs of a particular user-specified circuit design have been satisfied.

Figure 4C:
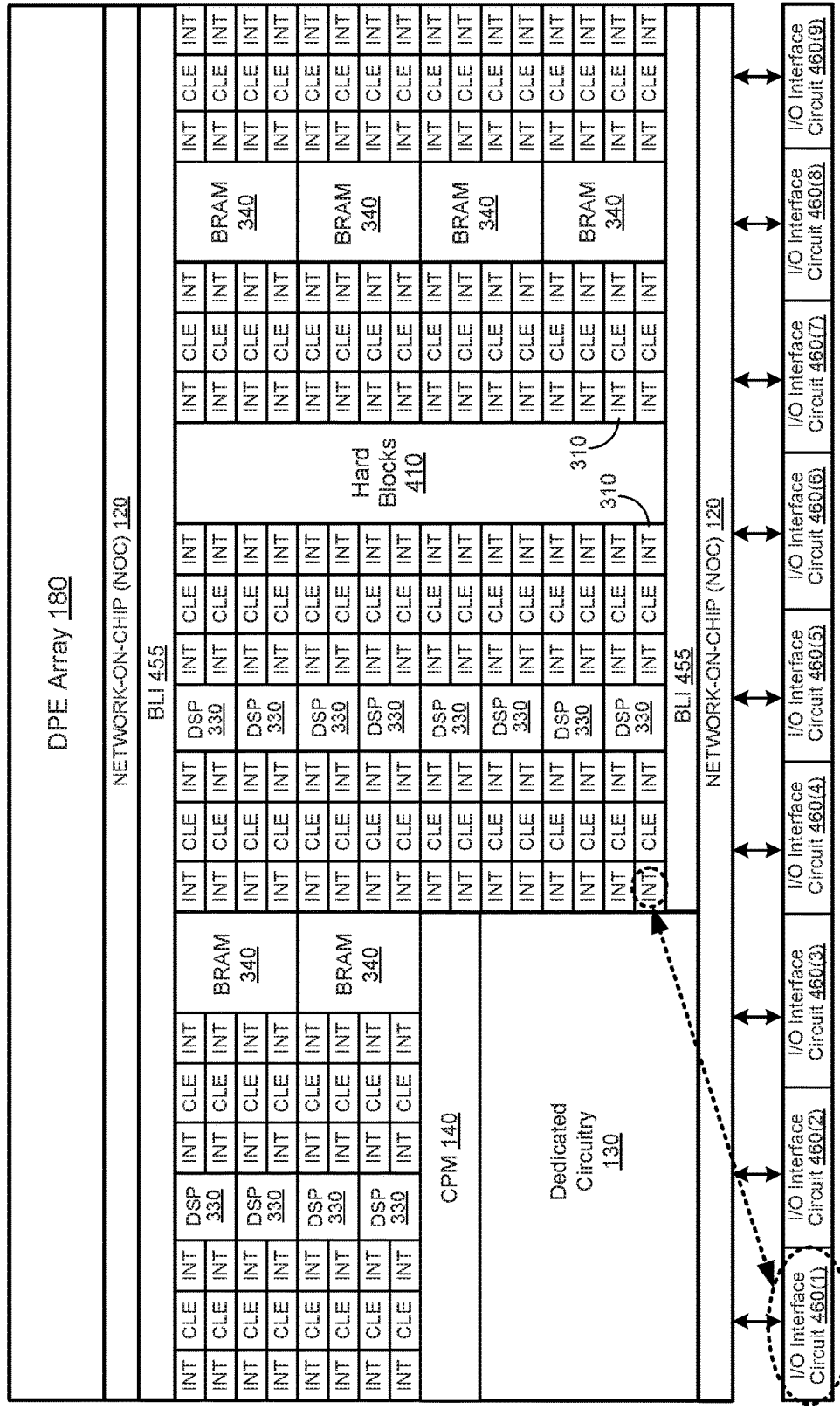
FIG. 4C shows a block diagram of another example programmable fabric including rows of I/O interface circuits, in accordance with some embodiments.

FIG. 4C shows a block diagram of another example programmable fabric 400C including rows of I/O interface circuits, in accordance with some embodiments. The programmable fabric 400C is similar to the programmable fabric 400B of FIG. 4B except, for example, that the row of I/O interface circuits 460(9)-460(18) positioned along the upper top of the programmable fabric 400B of FIG. 4B is occupied by a DPE array 180 in the programmable fabric 400C of FIG. 4C. Further, although shown to include eight I/O interface circuits 460(1)-460(9) in the example of FIG. 4C, the programmable devices disclosed herein may include any suitable number of I/O interface circuits 460, which may be arranged in any suitable number of rows (and/or columns) of various heights, widths, or lengths.

Although the upper row of the BLI 455 is depicted in the example of FIG. 4C as extending across an entire width of the programmable fabric 400C, in actual embodiments, the upper row of the BLI 455 may not extend across the entire width of the programmable fabric 400C. Further, it is noted that each of the lower and upper rows of the BLI 455 may displace one or more rows (or partial rows) of INTs 310, CLEs 320, DSPs 330, and BRAMs 340 associated with the programmable fabric 400C. Thus, in some aspects, shortening the upper row of the BLI 455 (such that the upper row does not extend across the entire width of the programmable fabric 400C) may allow the programmable fabric 400C to include a number of additional INTs 310, CLEs 320, DSPs 330, and/or BRAMs 340.

Figure 5:
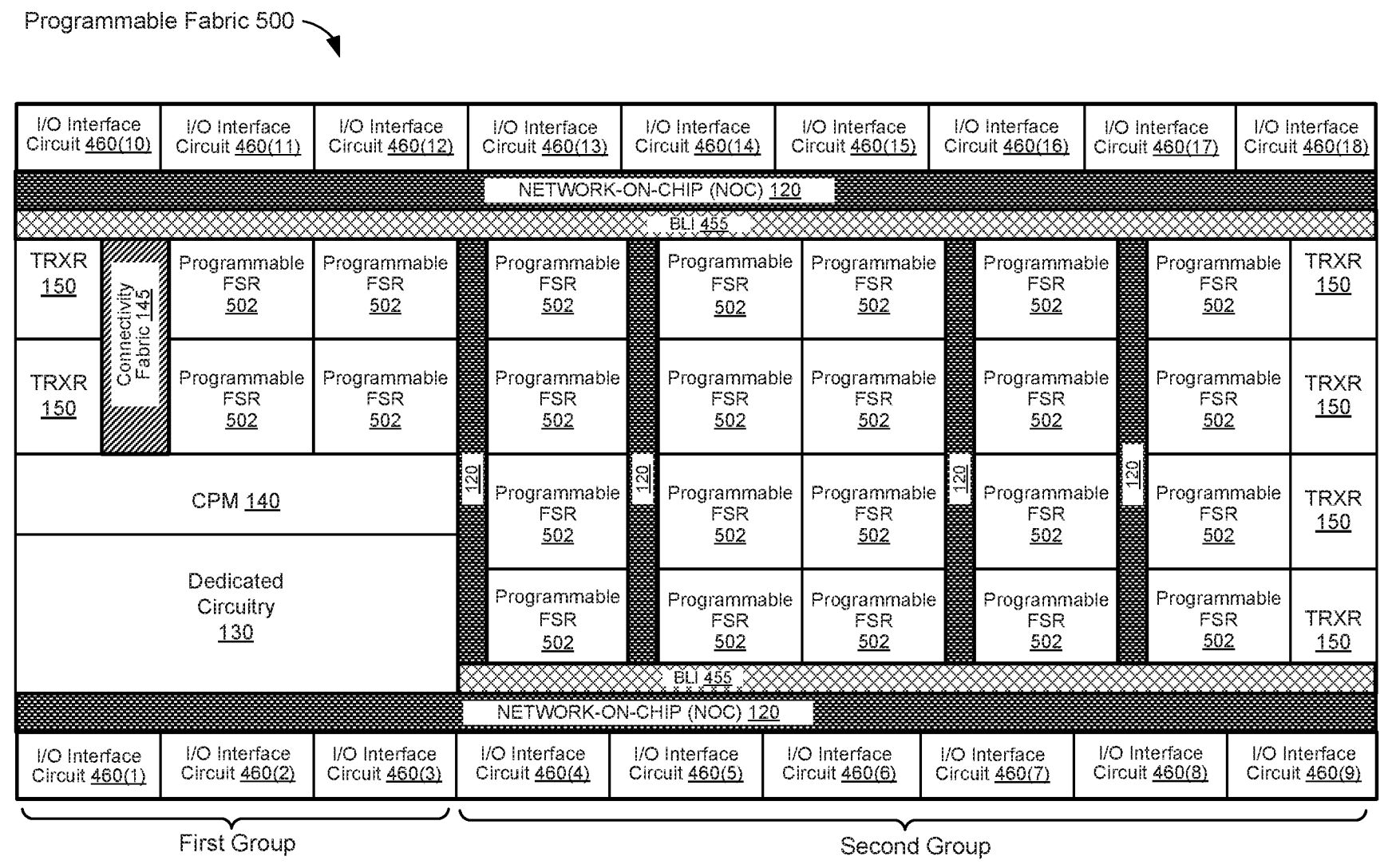

FIG. 5 shows a block diagram of another example programmable fabric 500 according to some embodiments. The programmable fabric 500 may be one implementation of the programmable fabric 400B of FIG. 4B, may be one implementation of the programmable fabric 400C of FIG. 4C, or both. The programmable fabric 500 is shown as including a plurality of programmable fabric sub-regions (FSRs) 502 and the NoC interconnect system 120. In some embodiments, the FSRs 502 may be implemented as repeatable tiles arranged in row and columns, for example, as depicted in FIG. 5. In addition, or in the alternative, each FSR 502 may include columns of CLBs, BRAMs, DSPs, and other suitable programmable circuitry, for example, in a manner similar to the programmable fabric of the programmable devices 400A-400C of FIGS. 4A-4C, respectively.

The NoC interconnect system 120 may include any number of horizontal segments, vertical segments, and diagonal segments connected together to implement a packet-based routing system across the programmable fabric 500. For the example embodiment of FIG. 5, the NoC interconnect system 120 is shown to include 2 horizontal segments and 4 vertical segments. More specifically, a first horizontal segment extending across the width of the programmable fabric 500 is positioned along the bottom row of I/O interface circuits 460, and a second horizontal segment extending across the width of the programmable fabric 500 is positioned along the top row of I/O interface circuits 460. In some embodiments, the I/O interface circuits 460 positioned along the bottom of the programmable fabric 500 may be coupled to the first horizontal segment of the NoC interconnect system 120, and the I/O interface circuits 460 positioned along the top of the programmable fabric 500 may be coupled to the second horizontal segment of the NoC interconnect system 120. In this manner, the NoC interconnect system 120 may be used to exchange signals and data with the I/O interface circuits 460 without any intervening circuits or interfaces.

The four vertical segments of the NoC interconnect system 120, which are connected to the first and second horizontal segments, extend across the height of the programmable fabric 500. In some embodiments, the four vertical segments may extend between corresponding ports of the first and second horizontal segments. In addition, or in the alternative, the four vertical segments of the NoC interconnect system 120 may be positioned between corresponding pairs of adjacent FSR columns.

Although the upper row of the BLI 455 is depicted in the example of FIG. 5 as extending across an entire width of the programmable fabric 500, in actual embodiments, the upper row of the BLI 455 may not extend across the entire width of the programmable fabric 500. Further, it is noted that each of the lower and upper rows of the BLI 455 may displace one or more rows (or partial rows) of INTs 310, CLEs 320, DSPs 330, and BRAMs 340 associated with the programmable fabric 400C. Thus, in some aspects, shortening the upper row of the BLI 455 (such that the upper row does not extend across the entire width of the programmable fabric 400C) may allow the programmable fabric 400C to include a number of additional INTs 310, CLEs 320, DSPs 330, and/or BRAMs 340, FIG. 6A shows a block diagram of an example I/O interface circuit 600 according to some embodiments. The I/O interface circuit 600, which may be one implementation of the I/O interface circuits 460 of FIG. 4A, FIG. 4B, FIG. 4C, and FIG. 5, may include an I/O circuit 610 and a memory controller 620. The I/O circuit 610 includes a number of first terminals 611 that can be coupled to a corresponding number of the device's I/O pins, includes a number of second terminals 612 that can be coupled to corresponding ports of the BLI 455 or the programmable interconnect fabric via signal lines 456, and includes a number of third terminals 613 coupled to the memory controller 620. The NoC interconnect system 120 may be connected to the BLI 455 or the programmable interconnect fabric via signal lines 121, and may be connected to the FSR 502 via signal lines 122. The BLI 455 or the programmable interconnect fabric may be connected to the FSR 502 via signal lines 123.

The I/O circuit 610 may be any suitable circuit or driver that can drive signals received from one or more external devices to the BLI 455 and/or the memory controller 620, and that can drive signals received from the BLI 455 and/or from the NoC interconnect system 120 via the memory controller 620 to the one or more external devices via the device's I/O pins. In some embodiments, the I/O circuit 610 may be compatible with DDR4, DDR5, LPDDR4, LPDDR5, and/or HBM protocols.

The memory controller 620 includes a number of first terminals 621 coupled to corresponding third terminals 613 of the I/O circuit 610, and includes a number of second terminals 622 that can be coupled to corresponding ports of the NoC interconnect system 120 via signal lines 125. In some embodiments, the memory controller 620 may be compatible with DDR4 memory, with DDR5 memory, LPDDR4 memory, and/or with LPDDR4 memory. In other embodiments, the memory controller 620 may be compatible with HBM (or another suitable type of memory device).

In some embodiments, the I/O circuit 610 may include a control terminal to receive a portion of the configuration data that determines the functions and operations performed by the I/O interface circuit 600. In some aspects, a first value of the configuration data portion may configure the I/O interface circuit 600 to provide connectivity between the device's I/O pins and the programmable fabric via the BLI 455 and/or the programmable interconnects, and a second value of the configuration data portion may configure the I/O interface circuit 600 to provide connectivity between the device's I/O pins and the programmable fabric via the NoC interconnect system 120. When the I/O interface circuit 600 is configured to provide connectivity between the device's I/O pins and the NoC interconnect system 120 via signal lines 125 (e.g., when the I/O interface circuit 600 is configured to operate as one of the first group of I/O interface circuits 460(1)-460(3) of FIGS. 4B, 4C, and 5), the signal lines 456 may not be present. Conversely, when the I/O interface circuit 600 is configured to provide connectivity between the device's I/O pins and the BLI 455 via signal lines 456 (e.g.; when the I/O interface circuit 600 is configured to operate as one of the second group of I/O interface circuits 460(4)-460(18) of FIGS. 4B and 5 or as one of the second group of I/O interface circuits 460(4)-460(9) of FIG. 4C), the signal lines 125 may not be present.

Figure 6B:
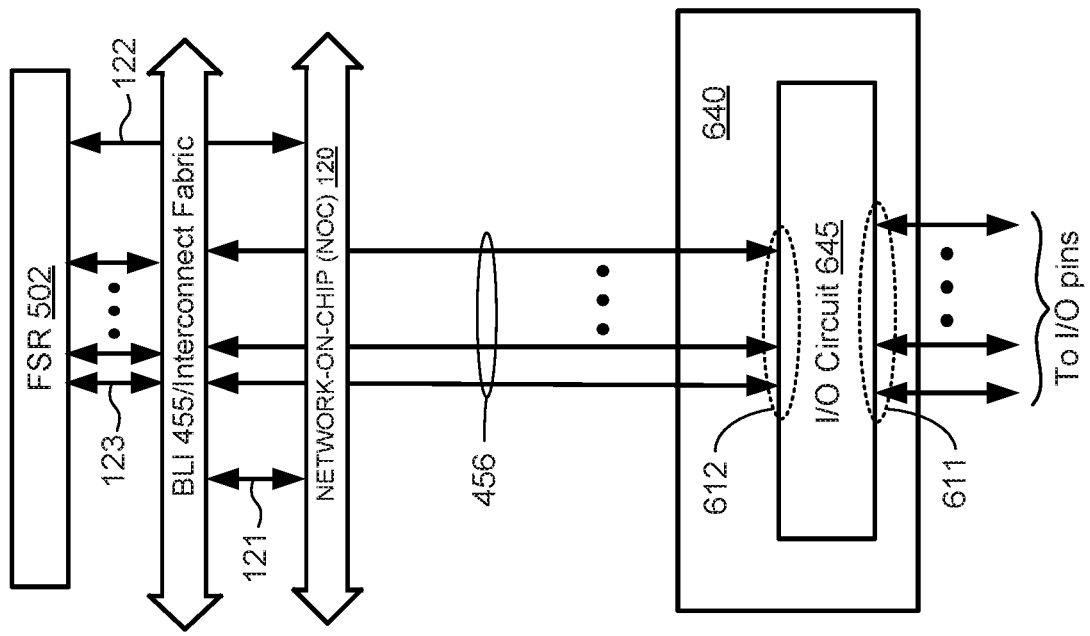
FIG. 6B shows a block diagram of another example I/O interface circuit, in accordance with some embodiments.
Figure 6A:
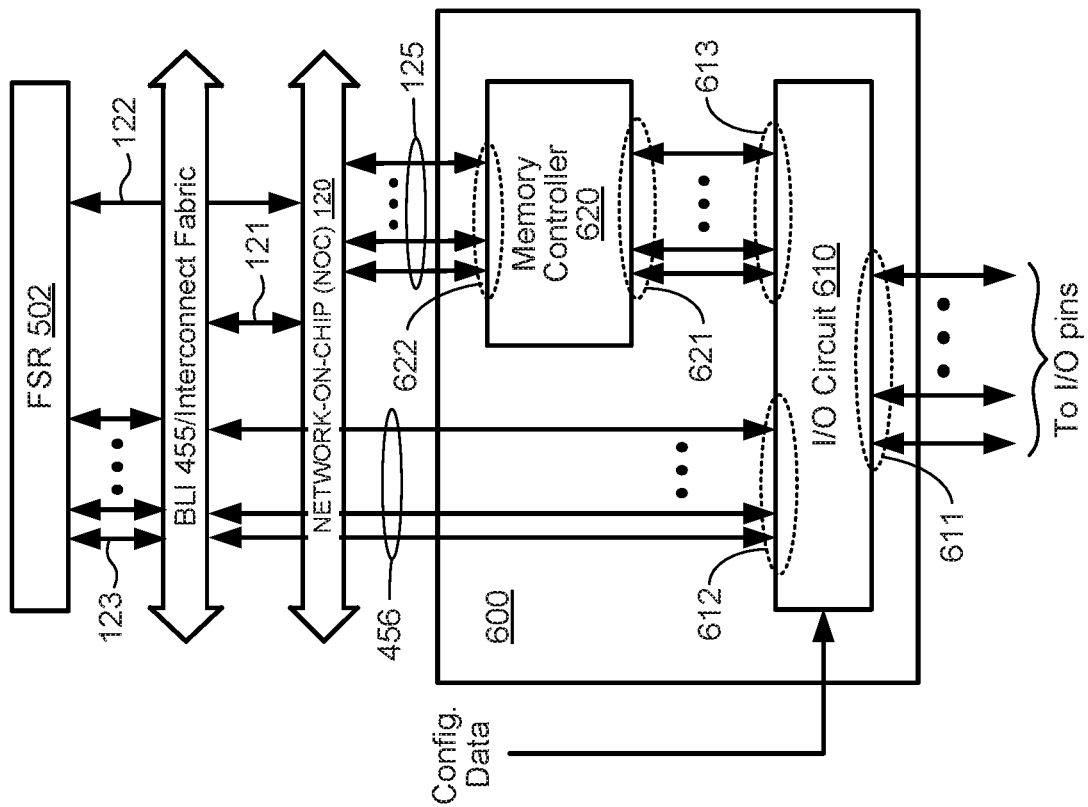
FIG. 6A shows a block diagram of an example I/O interface circuit, in accordance with some embodiments.

FIG. 6B shows a block diagram of another example I/O interface circuit 640, in accordance with some embodiments. The I/O interface circuit 640, which may be one implementation of the I/O interface circuits 460 of FIG. 4A, FIG. 4B, FIG. 4C, and FIG. 5, includes an I/O circuit 645 that provides a connectivity interface between a corresponding set of device I/O pins and the BLI 455 and/or the programmable interconnect fabric. For example, referring also to FIG. 4B, the I/O interface circuits 460 positioned directly above or directly below one of the programmable interconnect elements 310 (e.g., the second group of I/O interface circuits 460(4)-460(7) and 460(15)-460(18)) may establish signal interconnections with the programmable interconnect fabric via the BLI 455, and thus may not need a memory controller capable of communicating with the NoC interconnect system 120. However, the interface circuits 460 not positioned directly above or directly below one of the programmable interconnect elements 310 (e.g., the first group of I/O interface circuits 460(1)-460(3)) may need a memory controller capable of communicating with the NoC interconnect system 120, and may be implemented as the I/O interface circuit 600 of FIG. 6A.

In some embodiments, the I/O circuit 645 may include a number of first terminals 611 that can be coupled to a corresponding number of the device's I/O pins, and may include a number of second terminals 612 that can be coupled to corresponding ports of the BLI 455 or the programmable interconnect fabric via signal lines 456. The I/O circuit 645 may be any suitable circuit or driver that can drive signals received from one or more external devices to the BLI 455 or the programmable interconnect fabric, and that can drive signals received from the BLI 455 or the programmable interconnect fabric to the one or more external devices via the device's I/O pins. In some embodiments, the I/O circuit 645 may be compatible with DDR4, DDR5, LPDDR4, LPDDR5, and/or HBM protocols. The NoC interconnect system 120 may be connected to the BLI 455 or the programmable interconnect fabric via signal lines 121, and may be connected to the FSR 502 via signal lines 122. The BLI 455 or the programmable interconnect fabric may be connected to the FSR 502 via signal lines 123.

Figure 6C:
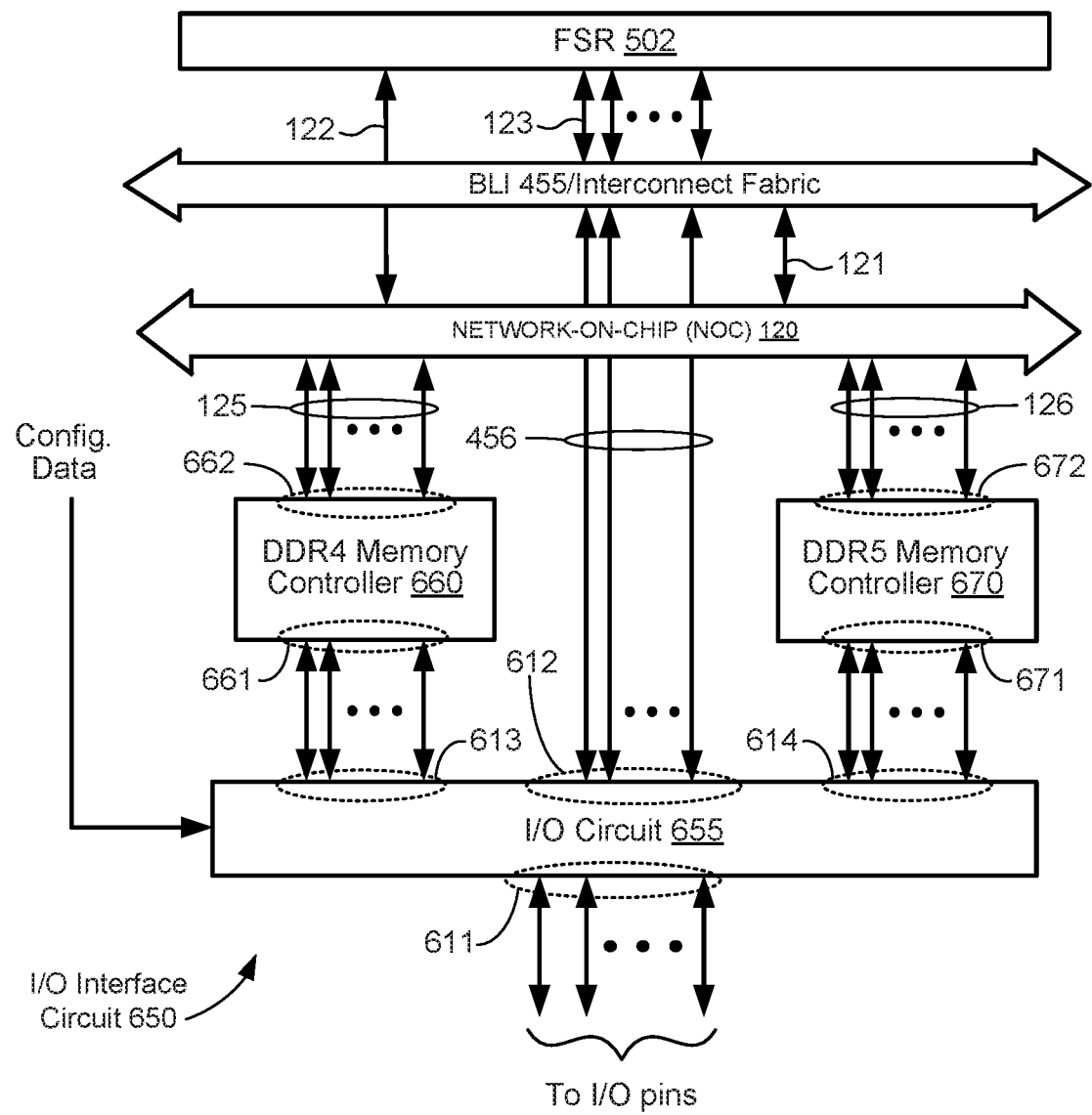
FIG. 6C shows a block diagram of another example I/O interface circuit, in accordance with some embodiments.

FIG. 6C shows a block diagram of another example I/O interface circuit 650, in accordance with some embodiments. The I/O interface circuit 650, which may be one implementation of the I/O interface circuits 460 of FIG. 4A, FIG. 4B, FIG. 4C, and FIG. 5, includes an I/O circuit 655, a DDR4 memory controller 660, and a DDR5 memory controller 670. The I/O circuit 655 may include a number of first terminals 611 that can be coupled to a corresponding number of the device's I/O pins, may include a number of second terminals 612 that can be coupled to corresponding ports of the BLI 455 or the programmable interconnect fabric, may include a number of third terminals 613 that can be coupled to the DDR4 memory controller 660, and may include a number of fourth terminals 614 that can be coupled to the DDR5 memory controller 670. The I/O circuit 655 may be any suitable circuit or driver that can drive signals received from one or more external devices to the BLI 455 or programmable interconnect fabric via the device's I/O pins, and that can drive signals received from the BLI 455 or programmable interconnect fabric to the one or more external devices via the device's I/O pins. In some aspects, the I/O circuit 655 may be compatible with DDR4, DDR5, LPDDR4, LPDDR5, and/or HBM protocols. The NoC interconnect system 120 may be connected to the BLI 455 or the programmable interconnect fabric via signal lines 121, and may be connected to the FSR 502 via signal lines 122. The BLI 455 or the programmable interconnect fabric may be connected to the FSR 502 via signal lines 123.

In some embodiments, the I/O circuit 655 may include a control terminal to receive a portion of the configuration data that determines the functions and operations performed by the I/O interface circuit 655. In some aspects, a first value of the configuration data portion may configure the I/O interface circuit 650 to provide connectivity between the device's I/O pins and the programmable fabric via the BLI 455 and/or the programmable interconnects, a second value of the configuration data portion may configure the I/O interface circuit 650 to provide connectivity between the device's I/O pins and the programmable fabric via the NoC interconnect system 120 using the DDR4 memory controller 660, and a third value of the configuration data portion may configure the I/O interface circuit 650 to provide connectivity between the device's I/O pins and the programmable fabric via the NoC interconnect system 120 using the DDR5 memory controller 670.

When the I/O interface circuit 650 is configured to provide connectivity between the device's I/O pins and the NoC interconnect system 120 via signal lines 125 (e.g., when the I/O interface circuit 650 is configured to operate as one of the first group of I/O interface circuits 460(1)-460(3) of FIGS. 4B, 4C, and 5 using the DDR4 memory controller 660), the signal lines 456 may not be present (and the signal lines 126 may not be present). Similarly, when the I/O interface circuit 650 is configured to provide connectivity between the device's I/O pins and the NoC interconnect system 120 via signal lines 126 (e.g., when the I/O interface circuit 650 is configured to operate as one of the first group of I/O interface circuits 460(1)-460(3) of FIGS. 4B, 4C, and 5 using the DDR5 memory controller 670), the signal lines 456 may not be present (and the signal lines 125 may not be present). Conversely, when the I/O interface circuit 650 is configured to provide connectivity between the device's I/O pins and the BLI 455 via signal lines 456 (e.g., when the I/O interface circuit 650 is configured to operate as one of the second group of I/O interface circuits 460(4)-460(18) of FIGS. 4B and 5 or as one of the second group of I/O interface circuits 460(4)-460(9) of FIG. 4C), the signal lines 125 and 126 may not be present.

The DDR4 memory controller 660 includes a number of first terminals 661 coupled to corresponding second terminals 612 of the I/O circuit 655, and includes a number of second terminals 662 that can be coupled to corresponding ports of the NoC interconnect system 120. In some embodiments, the DDR4 memory controller 660 may be compatible with DDR4 memory and/or with LPDDR4 or LPDDR5 memory.

The DDR5 memory controller 670 includes a number of first terminals 671 coupled to corresponding fourth terminals 614 of the I/O circuit 655, and includes a number of second terminals 672 that can be coupled to corresponding ports of the NoC interconnect system 120. In some embodiments, the DDR5 memory controller 670 may be configured to communicate with external DDR5 memory devices (not shown in FIG. 6C for simplicity) and also to communicate with the NoC interconnect system 120. In some aspects, the DDR5 memory controller 670 may be compatible with the data packet protocol used by the NoC interconnect system 120.

Each of the I/O pins may be assigned to either the DDR4 memory controller 660 or the DDR5 memory controller 670. In some embodiments, a first group of the I/O pins may be assigned to the DDR4 memory controller 660, and a second group of the I/O pins may be assigned to the DDR5 memory controller 670. In some other embodiments, the I/O pins may be coupled to the BLI and/or the programmable interconnect fabric without using either the DDR4 memory controller 660 or the DDR5 memory controller 670.

Figure 7:
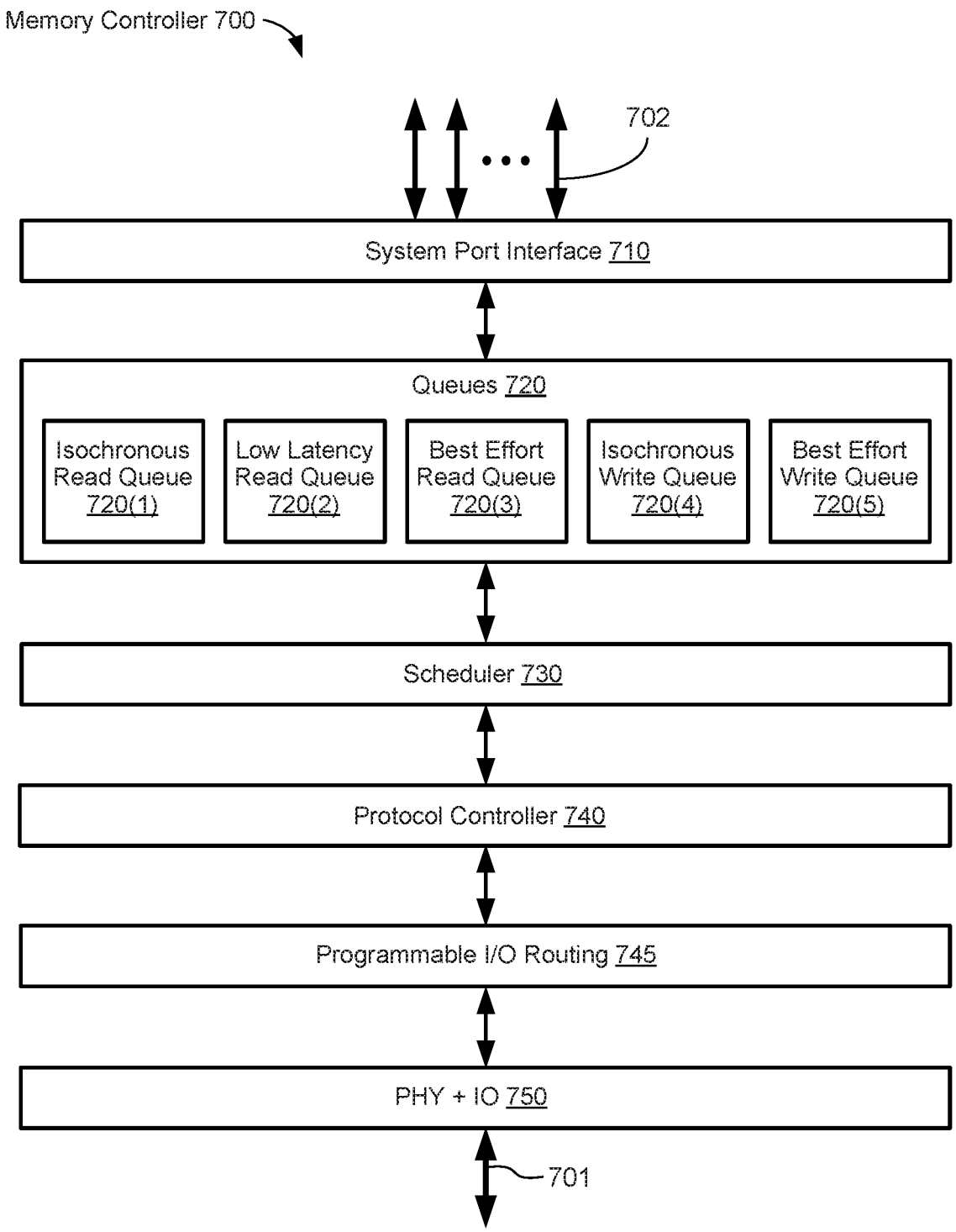
FIG. 7 shows a block diagram of an example memory controller, in accordance with some embodiments.

FIG. 7 shows a block diagram of an example DDR memory controller 700, in accordance with some embodiments. The DDR memory controller 700, which may be one implementation of the memory controller 620 of FIG. 6A, the DDR4 memory controller 660 of FIG. 6C, and/or the DDR5 memory controller 670 of FIG. 6C, may include a port interface 710, a number of data queues 720, a scheduler 730, a protocol controller 740, a programmable I/O routing layer 745, and a physical-layer (PHY) I/O circuit 750 coupled between I/O pins 701 and a system port 702. The port interface 710 may provide a system-level interface for providing connectivity between the DDR memory controller 700 and another subsystem or device. In some embodiments, the port interface 710 may convert data received from the device's I/O pins to packetized data, and may convert packetized data received from the NoC interconnect system 120 to data suitable for output to the device's I/O pins. In some aspects, the port interface 710 may include four 128-bit system ports and five data terminals. The system ports may be coupled to the NoC interconnect system 120, to the programmable interconnect, or any other external subsystem or device (such as a processing core in the APU 232 and/or the RPU 234 of FIG. 2). The five data terminals may be coupled to the data queues 720.

The data queues 720 may queue data to be read from a DDR memory, and may queue data to be written to the DDR memory. In some embodiments, the data queues 720 may provide QoS functionality, for example, to prioritize data based on traffic class. For the example embodiment of FIG. 7, the data queues 720 may include an isochronous read queue 720(1), a low-latency read queue 720(2), a best effort read queue 720(3), an isochronous write queue 720(4), and a best effort write queue 720(5). The scheduler 730, which is coupled between the data queues 720 and the protocol controller 740, may be used to schedule data for read and write operations associated with the data queues 720. In some embodiments, the scheduler 730 may include transaction reordering circuitry that can re-order read and write commands provided to the DDR memory in a manner that increases the efficiency with which the DDR memory is accessed.

The protocol controller 740 may be used to control or select one of a number of different data protocols to be used for a particular user-specified circuit design. The programmable I/O routing layer 745 may selectively couple each of a number of the I/O interface circuits 460 to the BLI 455 and/or the NoC interconnect system 120. The PHY 750 provides a physical layer connection between the DDR memory controller 700 and the device's I/O pins. In some embodiments, the PHY 750 may include dedicated memory (XPHY).

Figure 8:
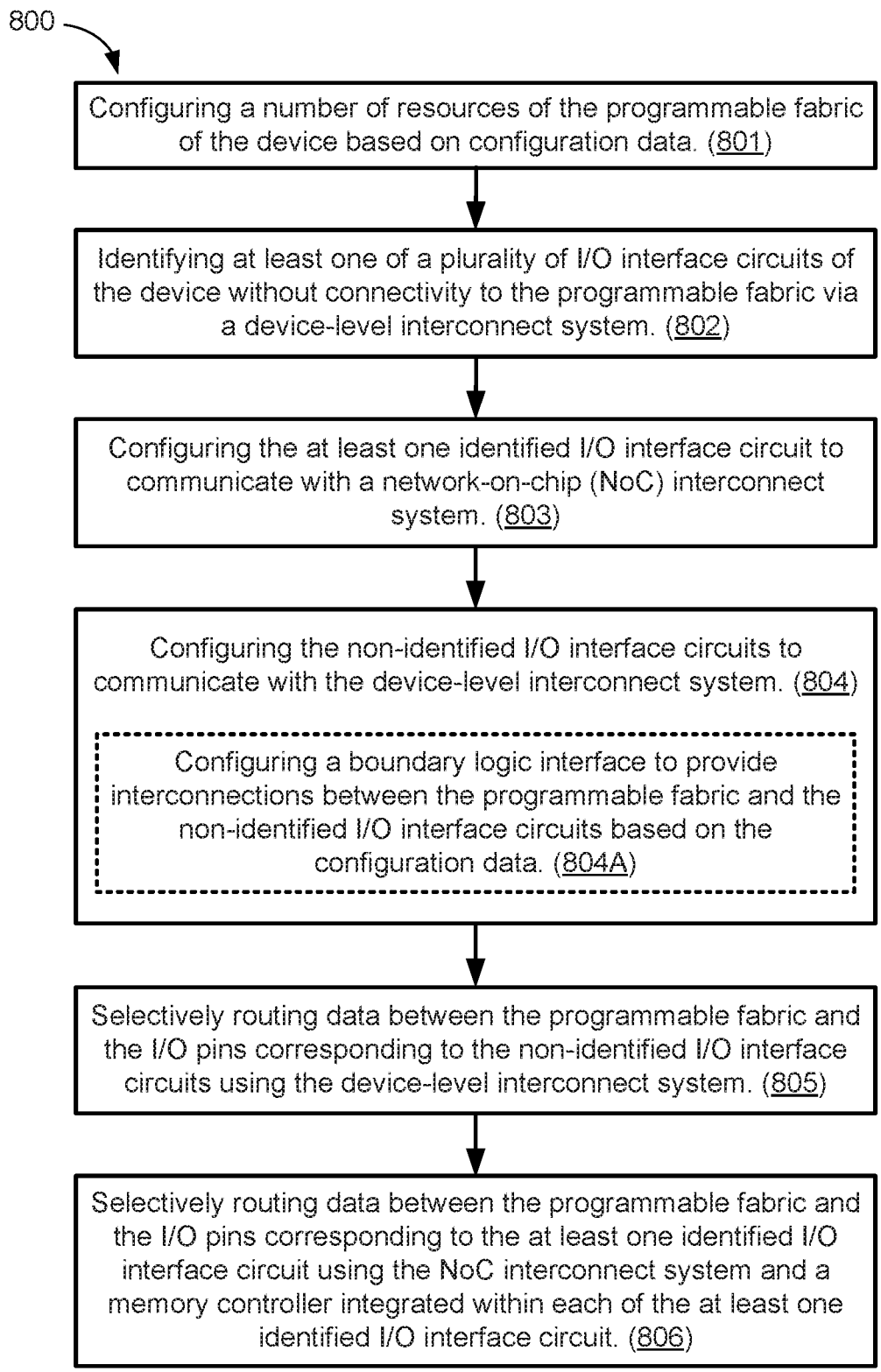
FIG. 8 illustrates an example method of operation of a programmable device, in accordance with some embodiments.

FIG. 8 is an illustrative flow chart depicting an example operation 800 for operating a programmable device, in accordance with some embodiments. The example operation 800 is described below with respect to a programmable device including the programmable fabric 400B of FIG. 4B for illustrative purposes. It is to be understood that the example operation 800 may be performed by other programmable devices having other programmable fabric provided in accordance with various embodiments disclosed herein.

The operation 800 may begin at block 801 by configuring a number of resources of the programmable fabric of the device based on configuration data. Referring also to FIG. 4B, the configuration data may be loaded into configuration registers associated with the programmable fabric 400B, and thereafter used to configure any number of the programmable interconnect elements 310, the CLEs 320, the DSPs 330, and/or the BRAMs 340 to implement a user-specified circuit design. The configuration data may also be used to program or configure various components of the dedicated circuitry 130, the CPM 140, the BLI 455, and the hard blocks 410.

The operation 800 may proceed at block 802 by identifying at least one I/O interface circuit without connectivity to the programmable fabric via a device-level interconnect system. Referring also to FIG. 4B, the I/O interface circuits 460(1)-460(3) positioned below a region of the programmable fabric 400B occupied by the dedicated circuitry 130 may not have connectivity to the programmable interconnect elements 310 via the BLI 455, for example, because the region occupied by the dedicated circuitry 130 may not have available area to accommodate the programmable interconnect elements 310. In some aspects, the positioning of the dedicated circuitry 130 within the programmable fabric 400B prevents the BLI 455 from providing connectivity between the first group of I/O interface circuits 460(1)-460(3) and the programmable interconnects (INT).

In some embodiments, identifying the at least one I/O interface circuit may be based at least in part on a distance between a respective I/O interface circuit and a nearest programmable interconnect element. For example, referring also to FIG. 4B, the distance between I/O interface circuit 460(1) and the nearest programmable interconnect element 310A (circled in FIG. 4B) may be greater than the distances between any of the other I/O interface circuits 460(2)-460(18) and their corresponding nearby programmable interconnect elements 310. Thus, because the I/O interface circuit 460(1) may be further from the nearest programmable interconnect element 310 than any of the other I/O interface circuits 460, providing connectivity for the identified I/O interface circuit 460(1) via the programmable interconnect elements 310 and the BLI 455 may be more difficult than providing connectivity for the other I/O interface circuits 460 (or may not be feasible due to the positioning of the dedicated circuitry 130 within the region of the programmable fabric 400B located above the identified I/O interface circuit 460(1)). As a result, the I/O interface circuit 460(1) may be identified for using the NoC interconnect system 120, rather than the device-level interconnect system formed by the BLI 455 and the programmable interconnect elements 310, to establish connectivity with the device's programmable fabric.

In some aspects, the distance between each of the I/O interface circuits 460 and a corresponding nearest programmable interconnect element 310 may be compared with a reference value to identify a first group of I/O interface circuits 460 that may be configured to access to the NoC interconnect system 120 for connectivity to the programmable fabric 400B. The first group may include the I/O interface circuits 460 for which their respective distances to the nearest programmable interconnect element 310 is greater than the reference value, and a second group of I/O interface circuits 460 may include the other I/O interface circuits 460 (e.g., the I/O interface circuits 460 for which their respective distances to the nearest programmable interconnect element 310 is not greater than the reference value).

The operation 800 may proceed at block 803 by configuring the at least one identified I/O interface circuit to communicate with a network interconnect system. Referring also to FIG. 6A, the I/O interface circuit 600 may be configured to communicate with the NoC interconnect system 120 by enabling the memory controller 620 and configuring the I/O circuit 610 to enable a path between its first terminals 611 and third terminals 613 while disabling a path between its first terminals 611 and second terminals 612. In this manner, the I/O interface circuit 600 may use its memory controller 620 to receive data from, and transmit data to, selected resources of the device's programmable fabric using the NoC interconnect system 120.

The operation 800 may proceed at block 804 by configuring the non-identified I/O interface circuits to communicate with the device-level interconnect system. Referring also to FIG. 6A, the I/O interface circuit 600 may be configured to communicate with the BLI 455 by disabling the memory controller 620 and configuring the I/O circuit 610 to enable the path between its first terminals 611 and second terminals 612 while disabling the path between its first terminals 611 and third terminals 613.

In some embodiments, configuring the non-identified I/O interface circuits to communicate with the device-level interconnect system may include configuring a boundary logic interface (BLI) to provide interconnections between the programmable interconnects and the non-identified I/O interface circuits (at block 804A). Referring also to FIG. 4B, the BLI 455 may be configured to selectively interconnect any number of the non-identified I/O interface circuits 460 with the programmable interconnect elements 310. In other embodiments, the BLI 455 may not be used to provide interconnections between the programmable interconnects and the non-identified I/O interface circuits, and therefore block 804A may be optional or omitted.

The operation 800 may proceed at block 805 by selectively routing data between the programmable fabric and the I/O pins corresponding to the non-identified I/O interface circuits using the device-level interconnect system. Referring also to FIG. 4B and continuing the above example, the non-identified I/O interface circuits 460(4)-460(9) may receive data from corresponding device I/O pins, and may transmit the received data to a number of destinations in the programmable fabric using the programmable interconnects. Also, the non-identified I/O interface circuits 460(4)-460(9) may receive data from one or more sources within the programmable fabric via the programmable interconnects, and may transmit the received data to the corresponding I/O pins. In some aspects, the device-level interconnect system routes data between the programmable fabric and the non-identified I/O interface circuits as non-packetized data.

The operation 800 may proceed at block 806 by selectively routing data between the programmable fabric and the I/O pins corresponding to the at least one identified I/O interface circuit using the NoC interconnect system 120 and a memory controller integrated within each of the at least one identified I/O interface circuit. Referring also to FIG. 4B, the identified I/O interface circuit 460(1) may receive data from corresponding I/O pins, and may use its memory controller to transmit the data to a number of destinations in the programmable fabric using the NoC interconnect system 120. The identified I/O interface circuit 460(1) may also receive data from one or more sources in the programmable fabric via the NoC interconnect system 120, and may drive the received data onto the corresponding I/O pins. In some aspects, the NoC interconnect system 120 routes data between the programmable fabric and the identified I/O interface circuits as individually addressable data packets.

In some embodiments, the NoC interconnect system 120 may be based at least in part on memory-mapped addresses assigned to components within each of the programmable circuit blocks and the I/O interface circuits. In some aspects, the memory device may be a DDR memory, and the memory controller may be a DDR memory controller.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example embodiments have been described with reference to specific example embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A programmable device comprising:
  programmable logic including a plurality of configurable logic elements;
  dedicated circuitry within a first region of the programmable logic and positioned along a first portion of a boundary of the programmable logic, wherein the dedicated circuitry is hard-wired;
  a row of input/output (I/O) interface circuits arranged along the boundary of the programmable logic and coupled to corresponding sets of I/O pins, wherein a first group of the I/O interface circuits is positioned beneath the first region that includes the dedicated circuitry, and a second group of the I/O interface circuits is positioned beneath a second region of the programmable logic that does not include the dedicated circuitry;
  a programmable interconnect fabric configured to selectively route data between the programmable logic and the second group of I/O interface circuits based on configuration data; and
  a network-on-chip (NoC) interconnect system configured to selectively route data between the programmable logic and the first group of I/O interface circuits.

2. The programmable device of claim 1, wherein the NoC interconnect system routes the data between the programmable logic and the first group of I/O interface circuits as individually addressable data packets, wherein the NoC interconnect system spans across a height and a width of the programmable logic.

3. The programmable device of claim 1, wherein each of the first group of I/O interface circuits includes a memory controller configured to communicate with the NoC interconnect system according to a data packet protocol.

4. The programmable device of claim 3, wherein the memory controller comprises a double data rate (DDR) memory controller.

5. The programmable device of claim 3, wherein the memory controller comprises:
  a protocol controller compatible with the data packet protocol; and
  a scheduler configured to schedule transmissions of data packets to the NoC interconnect system based at least in part on a priority or traffic class of the data packets.

6. The programmable device of claim 1, further comprising:
  a plurality of programmable interconnects; and
  a boundary logic interface (BLI) extending across the second region of the programmable logic and configured to provide connectivity between the second group of I/O interface circuits and the programmable interconnects based on the configuration data.

7. The programmable device of claim 6, wherein a positioning of the dedicated circuitry prevents the BLI from providing connectivity between the first group of I/O interface circuits and the programmable interconnects.

8. The programmable device of claim 1, wherein the dedicated circuitry includes at least one of a processor, a serial transceiver, a digital signal processor (DSP), an analog-to-digital converter (ADC), or a digital-to-analog converter (DAC).

9. The programmable device of claim 1, wherein a respective one of the I/O interface circuits is further configured to:
  transmit non-packetized data between the corresponding set of I/O pins and the programmable logic based on the configuration data indicating a first value; and
  transmit packetized data between the corresponding set of I/O pins and the NoC interconnect system based on the configuration data indicating a second value.

10. A system, comprising:
  a memory device; and
  a programmable device coupled to the memory device, the programmable device comprising:
  programmable logic including a plurality of columns of programmable fabric sub-regions;
  dedicated circuitry within a first region of the programmable logic and positioned along a first portion of a boundary of the programmable logic, wherein the dedicated circuitry is hard-wired;
  a row of input/output (I/O) interface circuits each coupled to a corresponding set of I/O pins of the programmable device, wherein a first group of the I/O interface circuits is positioned beneath the first region that includes the dedicated circuitry, and a second group of the I/O interface circuits is positioned beneath a second region of the programmable logic that does not include the dedicated circuitry;

a programmable interconnect fabric to selectively route data between the programmable logic and the second group of I/O interface circuits; and a network-on-chip (NoC) interconnect system configured to selectively route data between the programmable logic and the first group of I/O interface circuits.

11. The system of claim 10, wherein the NoC interconnect system routes the data between the programmable logic and the first group of I/O interface circuits as individually addressable data packets.

12. The system of claim 10, wherein each of the first group of I/O interface circuits includes a memory controller configured to communicate with the NoC interconnect system according to a data packet protocol.

13. The system of claim 10, wherein the dedicated circuitry includes at least one of a processor, a serial transceiver, a digital signal processor (DSP), an analog-to-digital converter (ADC), or a digital-to-analog converter (DAC).

14. The system of claim 10, further comprising:
a boundary logic interface (BLI) extending across the second region of the programmable logic and configured to provide connectivity between the second group of I/O interface circuits and the programmable fabric sub-regions based on configuration data.

15. The system of claim 14, wherein a positioning of the dedicated circuitry prevents the BLI from providing connectivity between the first group of I/O interface circuits and the programmable fabric sub-regions.

16. A method of operating a device including programmable fabric, comprising:
configuring a number of resources of the programmable fabric based on configuration data;
identifying at least one of a plurality of input/output (I/O) interface circuits of the device without connectivity to the programmable fabric via a device-level interconnect system due to hard-wired dedicated circuitry in the programmable fabric;
configuring the at least one identified I/O interface circuit to communicate with a network-on-chip (NoC) interconnect system;
configuring the non-identified I/O interface circuits to communicate with the device-level interconnect system;
selectively routing data between the programmable fabric and I/O pins corresponding to the non-identified I/O interface circuits using the device-level interconnect system; and
selectively routing data between the programmable fabric and the I/O pins corresponding to the at least one identified I/O interface circuit using the NoC interconnect system and a memory controller integrated within each of the at least one identified I/O interface circuit.

17. The method of claim 16, wherein the memory controller and the NoC interconnect system operate according to a data packet protocol.

18. The method of claim 16, wherein the NoC interconnect system routes the data between the programmable fabric and the at least one identified I/O interface circuit as individually addressable data packets.

19. The method of claim 16, further comprising:
configuring a boundary logic interface (BLI) to provide interconnections between the programmable fabric and the non-identified I/O interface circuits based on the configuration data.

20. The method of claim 16, wherein the identifying is based at least in part on a distance between a respective I/O interface circuit and a nearest programmable interconnect element within the programmable fabric.

* * * * *